US012207538B2

(12) United States Patent
Bok

(10) Patent No.: US 12,207,538 B2
(45) Date of Patent: Jan. 21, 2025

(54) DISPLAY DEVICE AND ELECTRONIC APPARATUS INCLUDING THE SAME

(71) Applicant: Samsung Display Co., Ltd., Yongin-Si (KR)

(72) Inventor: Seunglyong Bok, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 519 days.

(21) Appl. No.: 17/560,797

(22) Filed: Dec. 23, 2021

(65) Prior Publication Data

US 2022/0399511 A1     Dec. 15, 2022

(30) Foreign Application Priority Data

Jun. 10, 2021   (KR) .................. 10-2021-0075638

(51) Int. Cl.
| | |
|---|---|
| H10K 77/10 | (2023.01) |
| B32B 7/12 | (2006.01) |
| B32B 15/04 | (2006.01) |
| H10K 59/12 | (2023.01) |
| H10K 102/00 | (2023.01) |

(52) U.S. Cl.
CPC ............ H10K 77/111 (2023.02); B32B 7/12 (2013.01); B32B 15/043 (2013.01); H10K 59/12 (2023.02); *B32B 2457/20* (2013.01); *H10K 2102/311* (2023.02)

(58) Field of Classification Search
CPC ............... H10K 77/111; H10K 59/12; H10K 2102/311; B32B 7/12; B32B 15/043; B32B 2457/20

USPC .......................................................... 257/40
See application file for complete search history.

(56) References Cited

U.S. PATENT DOCUMENTS

| | | | |
|---|---|---|---|
| 10,572,041 B2 | 2/2020 | Lee et al. | |
| 2018/0138440 A1* | 5/2018 | Chung | ............... H10K 59/40 |
| 2019/0357366 A1* | 11/2019 | Choi | ................ H04M 1/0268 |
| 2020/0128687 A1* | 4/2020 | Ku | ..................... G06F 1/1681 |
| 2020/0409420 A1 | 12/2020 | Nakamura et al. | |
| 2021/0181847 A1* | 6/2021 | Noh | .................... G06F 3/0412 |
| 2021/0367020 A1 | 11/2021 | Bok et al. | |

FOREIGN PATENT DOCUMENTS

| | | | | |
|---|---|---|---|---|
| CN | 108268093 A | * | 7/2018 | .......... G06F 1/1616 |
| JP | 2021-009363 A | | 1/2021 | |
| KR | 10-2004-0103303 A | | 12/2004 | |
| KR | 101631898 B1 | * | 6/2016 | |
| KR | 10-1811424 A | | 12/2017 | |
| KR | 10-2021-0145896 A | | 12/2021 | |

* cited by examiner

*Primary Examiner* — Igwe U Anya
(74) *Attorney, Agent, or Firm* — Innovation Counsel LLP

(57) ABSTRACT

For a display device having reinforced structural characteristics and an electronic apparatus including the display device, the display device includes a display panel including a first display area, a second display area including a keyboard area, and a folding display area between the first display area and the second display area, a cover window arranged on a front surface of the display panel and including a first section and a second section, wherein the first section and the second section respectively overlap the first display area and the second display area on a plane, and a base plate arranged on a rear surface of the display panel, wherein a thickness of the second section of the cover window is greater than a thickness of the first section of the cover window.

21 Claims, 24 Drawing Sheets

UNFOLDING

UNFOLDING

FOLDING

DISPLAY DEVICE AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2021-0075638 that was filed on Jun. 10, 2021 in the Korean Intellectual Property Office, the disclosure of which is incorporated by reference herein in its entirety.

BACKGROUND

1. Field

One or more embodiments relate to a display device and an electronic apparatus including the same, and more particularly, to a display device in which a display area includes a keyboard area, and an electronic apparatus including the same.

2. Description of the Related Art

Mobile electronic apparatuses are widely used. Examples of widely-used mobile electronic apparatuses include laptops and tablet personal computers (PCs) as well as small electronic apparatuses such as mobile phones.

Such mobile electronic apparatuses include a display device to provide various functions, for example, a function of providing visual information such as an image or a video, to a user. Recently, a method of expanding a display area of the display device and simultaneously adding various functions to the display area has been studied.

In order to increase the area of the display area while reducing the total size of the electronic apparatus, a display device of which part is folded or rolled, has been developed.

SUMMARY

One or more embodiments include a display device in which various functions are added to a display area, and an electronic apparatus including the same. As a method of adding various functions to a display area while enlarging the display area of a display device, one or more embodiments also include a display device in which a display area includes a keyboard area, and an electronic apparatus including the same. Furthermore, one or more embodiments also include a display device including a display area in which structural characteristics of a keyboard area are reinforced, and an electronic apparatus including the same. However, these objectives are just examples, and the scope of the present disclosure is not limited thereby.

Additional aspects will be set forth in part in the description which follows and, in part, will be apparent from the description, or may be learned by practice of the presented embodiments of the disclosure.

According to one or more embodiments, a display device includes a display panel including a first display area, a second display area including a keyboard area, and a folding display area between the first display area and the second display area, a cover window arranged on a front surface of the display panel and comprising a first section and a second section, wherein the first section and the second section respectively overlap the first display area and the second display area on a plane, and a base plate arranged on a rear surface of the display panel, wherein a thickness of the second section of the cover window may be greater than a thickness of the first section of the cover window.

The display device may further include a foldable plate arranged on the base plate, and a metal sheet arranged on the foldable plate.

The display device may further include a cushion layer between the base plate and the foldable plate and overlapping the second display area on the plane.

A portion of the metal sheet overlapping the keyboard area of the second display area may be thicker than a portion of the metal sheet overlapping the first display area.

The metal sheet may include a first metal sheet entirely overlapping the display panel, and a second metal sheet arranged on one surface of the first metal sheet and overlapping the keyboard area of the second display area.

The display device may further include a first adhesive layer and a second adhesive layer, which are arranged on one surface of the foldable plate and respectively overlap the first display area and the second display area, and the first adhesive layer may have a higher elongation rate than an elongation rate of the second adhesive layer.

The display panel may further include a first rolling display area and a second rolling display area, which are arranged at two opposite sides of the first display area.

According to one or more embodiments, an electronic apparatus includes a display device configured to provide an image and a lower cover arranged on a lower portion of the display device, wherein the display device may include a display panel including a first display area, a second display area including a keyboard area, and a folding display area between the first display area and the second display area, a cover window arranged on a front surface of the display panel and respectively overlapping the first display area and the second display area on a plane, and a base plate arranged on a rear surface of the display pane, and the thickness of the second section of the cover window may be greater than the thickness of the first section of the cover window.

The base plate of the display device may include a first base plate overlapping the first display area on a plane and being slidable with respect to the lower cover, and a second base plate spaced apart from the first base plate on a plane, overlapping the second display area and attached to the lower cover.

The electronic apparatus may further include an elastic member configured to connect the lower cover ad the first base plate of the base plate.

The display device may further include a foldable plate arranged on the base plate and a metal sheet arranged on the foldable plate.

The display device may further include a cushion layer between the base plate and the foldable plate and overlapping the second display area on the plane.

A portion of the metal sheet of the display device overlapping the keyboard area of the second display area may be thicker than a portion of the metal sheet of the display device overlapping the first display area.

The metal sheet of the display device may include a first metal sheet entirely overlapping the display panel, and a second metal sheet arranged on one surface of the first metal sheet and overlapping the keyboard area of the second display area.

The electronic apparatus may further include a first adhesive layer and a second adhesive layer, which are arranged on one surface of the foldable plate and respectively overlap the first display area and the second display area, wherein the first adhesive layer may have a higher elongation rate than an elongation rate of the second adhesive layer.

The display panel of the display device may further include a third display area at least partially surrounded by the first display on the plane and having a lower resolution than a resolution of the first display area.

Each of the base plate, the foldable plate, and the metal sheet of the display device may include a hole aligned with the third display area.

The electronic apparatus may further include an electronic component aligned with the third display area.

The electronic component may overlap the third display area when the display device is folded as well as the display device is unfolded.

The electronic apparatus may further include a force sensor arranged on a lower portion of the display device and overlapping a portion of the second display area on the plane.

The display panel of the display device may further include a first rolling display area and a second rolling display area, which are arranged at two opposite sides of the first display area.

Other aspects, features, and advantages than the above-described aspects, features, and advantages will be apparent from a detailed description of the present disclosure, the claims, and the drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
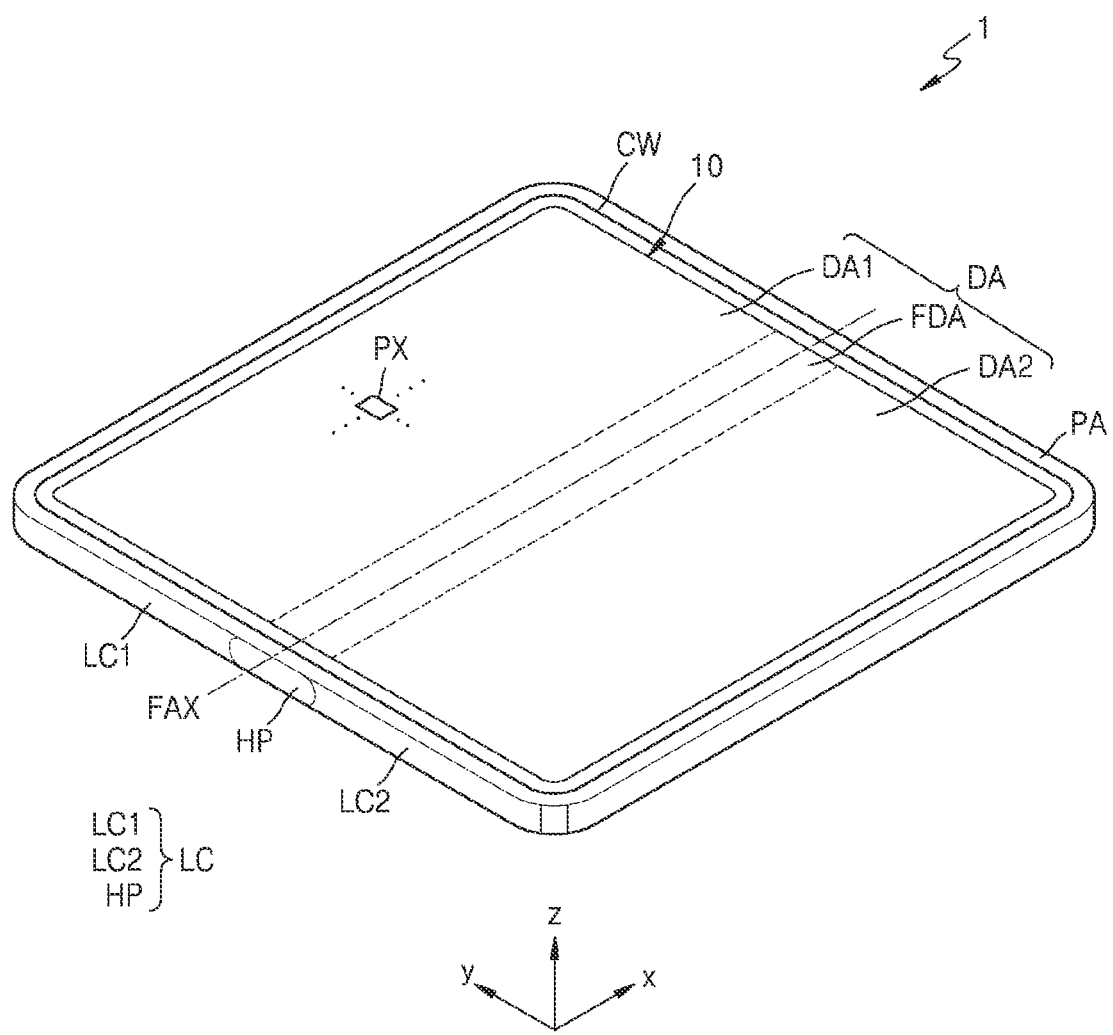
FIGS. 1A and 1B are perspective views schematically illustrating an electronic apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The effects and features of the present disclosure, and ways to achieve them will become apparent by referring to embodiments that will be described later in detail with reference to the drawings. However, the present disclosure is not limited to the following embodiments but may be embodied in various forms.

Hereinafter, embodiments of the present disclosure will be described below in more detail with reference to the accompanying drawings. Those components that are the same or are in correspondence are rendered the same reference numeral regardless of the figure number, and a redundant description therewith is omitted.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it may be directly or indirectly formed on the other layer, region, or component. That is, for example, intervening layers, regions, or components may be present.

Sizes of elements in the drawings may be exaggerated or reduced for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present specification, "A and/or B" refers to A, B, or A and B. And, "at least one of A and B" refers to A, B, or A and B.

It will be understood that when a layer, region, or component is referred to as being "connected to," another layer, region, or component, it may be directly or indirectly connected to the other layer, region, or component. That is, for example, intervening layers, regions, or components may be present. It will be understood that when a layer, region, or component is referred to as being "electrically connected to," another layer, region, or component, it may be directly or indirectly electrically connected to the other layer, region, or component. That is, for example, intervening layers, regions, or components may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 1B:
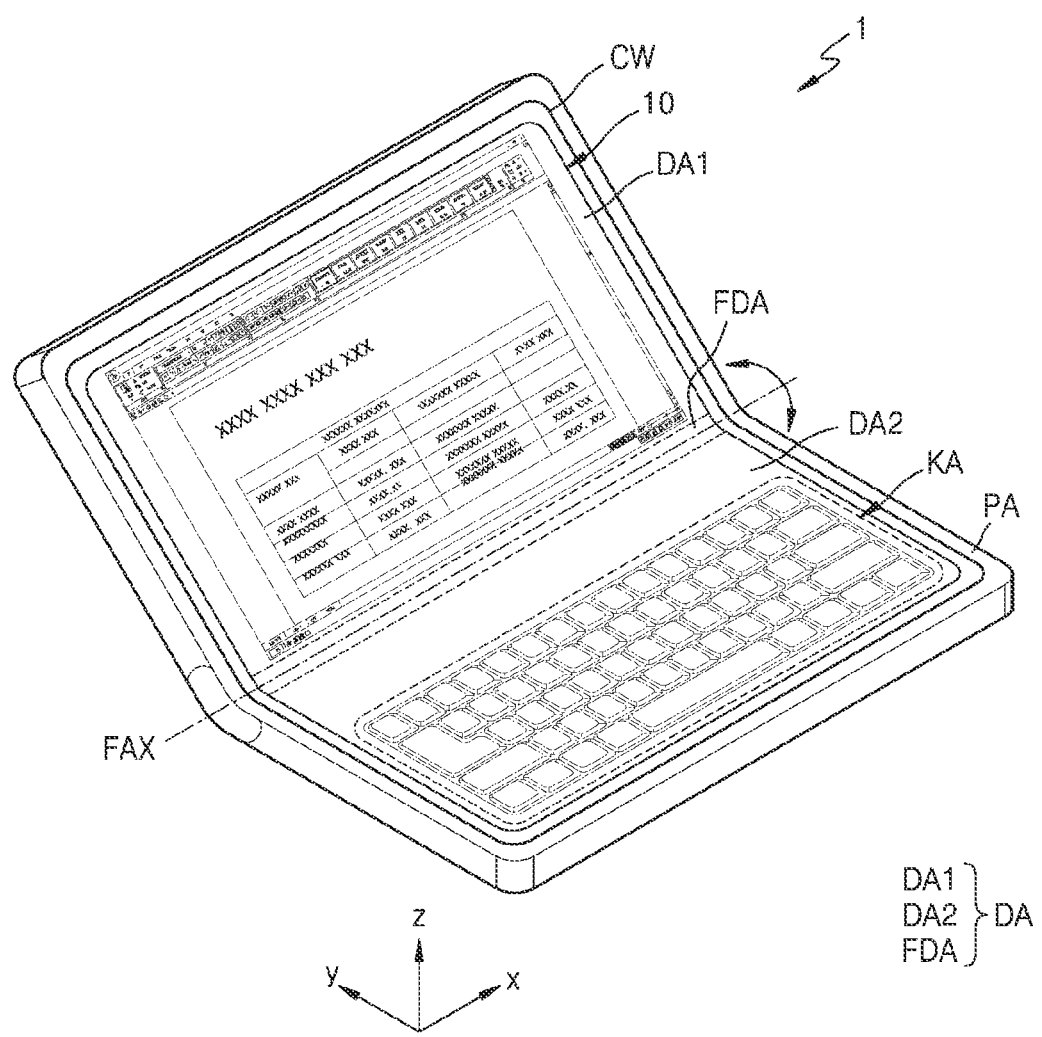

FIGS. 1A and 1B are perspective views schematically illustrating an electronic apparatus according to an embodiment. FIG. 1A illustrates a state in which the electronic apparatus is unfolded, i.e., an unfolded state, and FIG. 1B illustrates a state in which the electronic apparatus is folded, i.e., a folded state.

Referring to FIGS. 1A and 1B, an electronic apparatus 1 may include a lower covet LC, a display device 10, and a cover window CW.

The lower cover LC may be arranged on a lower portion of the display device 10 and may include a first part LC1 and a second part LC2 supporting the display device 10. In an embodiment, the lower cover LC may be folded about a folding axis FAX between the first part LC1 and the second part LC2. To this end, the lower part LC may include a hinge portion HP between the first part LC1 and the second part LC2.

The display device 10 may provide an image and may include a display area DA and a peripheral area PA outside the display area DA. A plurality of (sub-)pixels may be arranged in the display area DA, and the display area DA may provide an image through an array of the plurality of (sub-)pixels. The peripheral area PA may be a non-display area in which no image is provided, and various wirings, a driving circuit, and the like for providing an electrical signal or power to the display area DA may be arranged in the peripheral area PA.

In an embodiment, the display area DA may include a first display area DA1 and a second display area DA2 arranged on different sides of the folding axis FAX crossing the display area DA. Also, the display area DA may further include a folding display area FDA between the first display area DA1 and the second display area DA2. The folding axis FAX may extend across the folding display area FDA. In an example, the first display area DA1, the second display area DA2, and the folding display area FDA may provide images independent of each other, and in another example, the first display area DA1, the second display area DA2, and the folding display area FDA may provide one whole image.

The first display area DA1 and the second display area DA2 of the display device 10 may overlap the first part LC1 and the second part LC2 of the lower cover LC, respectively. The folding display area FDA of the display device 10 may overlap the hinge portion HP of the lower cover LC. The display device 10 may be folded about the folding axis FAX. The folding display area FDA may be an area that gets bent as the display device 10 is folded. When the display device 10 is folded, the first display area DA1 and the second display area DA2 of the display device 10 may face each other.

FIGS. 1A and 1B illustrate a case where the folding axis FAX extends in an x-direction. However, in another embodiment, the folding axis FAX may extend in a y-direction. In another embodiment, the folding axis FAX on a xy plane may also extend in a direction non-parallel to the x-direction and the y-direction. Also, FIGS. 1A and 1B illustrate a case where there is one folding axis FAX, However, in another embodiment, the display device 10 may be folded multiple times about a plurality of folding axes FAX that extend across the display area DA.

The cover window CW may be arranged on the display device 10 and may cover the display device 10. The cover window CW may be folded or bent according to an external force without cracks or the like. When the display device 10 is folded about the folding axis FAX, the cover window CW may also be folded together therewith.

The electronic apparatus 1 may approximately have a rectangular shape when viewed in a direction perpendicular to a surface thereof. For example, the electronic apparatus 1 may entirely have a rectangular planar shape with a side extending in a first direction (for example, x-direction) and a side extending in a second direction (for example, y-direction), as shown in FIG. 1A. A corner at which a side in the first direction and a side in the second direction meet each other, may have a right-angled shape or a round shape with a certain curvature, as shown in FIG. 1A. The planar shape of the electronic apparatus 1 is not limited to a rectangle and may be various shapes such as polygon shapes, for example, triangles, circular shapes, ellipses, and irregular shapes.

The electronic apparatus 1 may include a portable device, such as a mobile phone, a smartphone, a tablet personal computer (PC), a mobile communication terminal, an electronic notebook, an electronic book, a portable multimedia player (PMP), a navigation device, or an ultra mobile PC (UMPC), or devices of various product groups such as televisions (TVs), laptops, monitors, billboards, Internet of things (IoT). Hereinafter, for convenience of explanation, a case where the electronic apparatus 1 is a laptop, will be described.

In an embodiment, as shown in FIG. 1B, a second display area DA2 of the electronic apparatus 1 may include a keyboard area KA. The keyboard area KA may be an area used as a keyboard for inputting data, such as characters, to the electronic apparatus 1. For example, hi order for the electronic apparatus 1 to receive character data from a user, a certain area of the second display area DA2 may be configured to display the arrangement of characters, and the user may input corresponding characters by touching the displayed characters on the display. The certain area may be defined as the keyboard area KA. In this way, as a portion of the display area DA may be provided as the keyboard area KA, a separate input device such as a keyboard may not need to be provided, so that convenience may be provided to the user.

Figure 2:
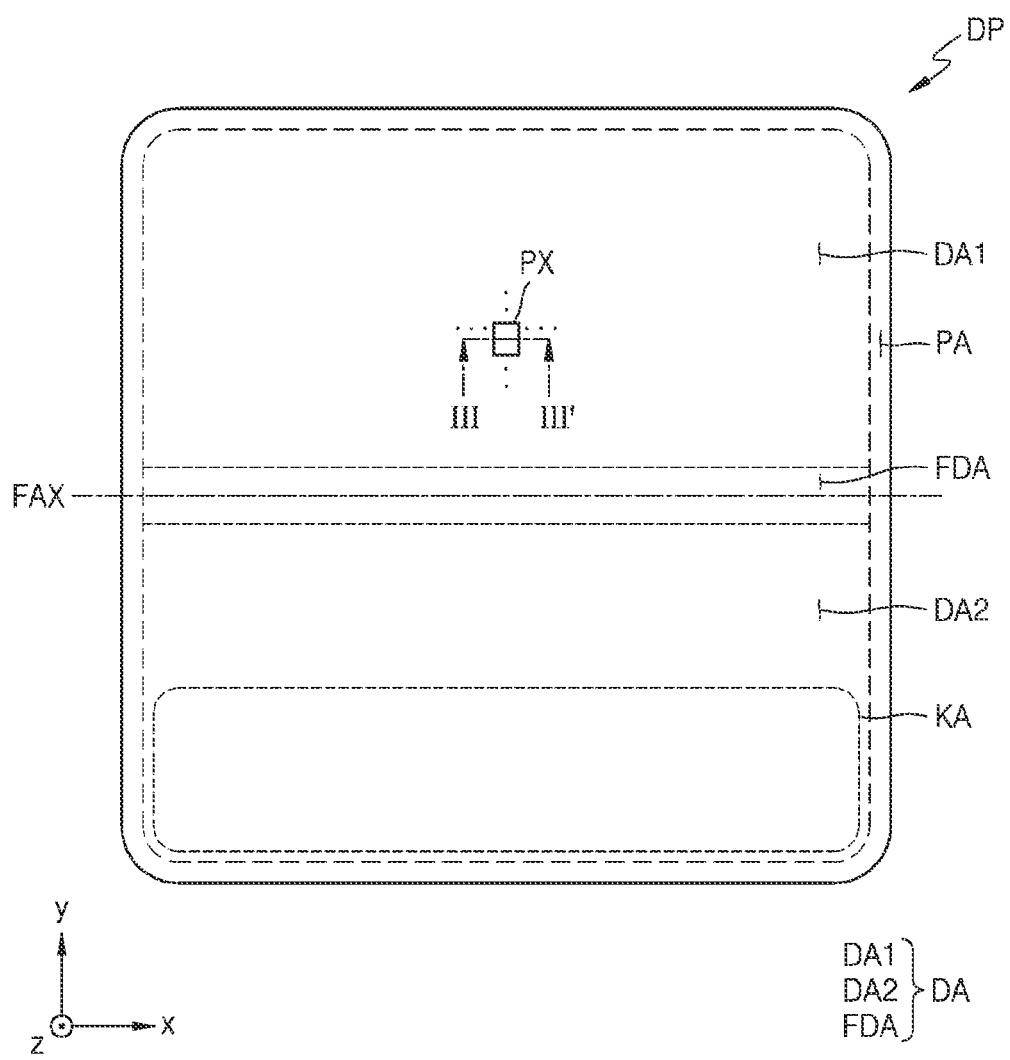
FIG. 2 is a plan view schematically illustrating a display panel provided in a display device of the electronic apparatus according to an embodiment.

FIG. 2 is a plan view schematically illustrating a display panel provided in a display device of the electronic apparatus according to an embodiment.

Referring to FIG. 2, a display panel DP may include a display area DA and a peripheral area PA outside the display area DA. For example, the display panel DP may include a first display area DA1, a second display area DA2, and a folding display area FDA between the first display area DA1 and the second display area DA2, which are the display area DA. For example, the ratio of the first display area DA1 with respect to the entire display area DA may be the same as the ratio of the second display area DA2 with respect to the display area DA and may be greater than the ratio of the folding display area FDA with respect to the display area DA.

The folding axis FAX may be arranged to extend across the folding display area FDA. The display panel DP, which is a flexible display panel that may be easily bent, folded, or rolled, may be a foldable display panel. The display panel DP may be folded about the folding axis FAX. In this case, the folding display area FDA may be bent, and the first display area DA1 and the second display area DA2 may face each other.

In an embodiment, when the display panel DP is entirely folded, in order to decrease the total size of the display panel DP (i.e., a planar area), the first display area DA1 and the second display area DA2 may have the same shape and the same area on the plane.

The second display area DA2 of the display panel DP may include the keyboard area KA described above. The keyboard area KA may be arranged on one side of the second display area DA2. For example, as shown in FIG. 2, the keyboard area KA may be adjacent to the lower end of the second display area DA2. Thus, the keyboard area KA may be close to the user so that the user's convenience may be increased.

Figure 3:
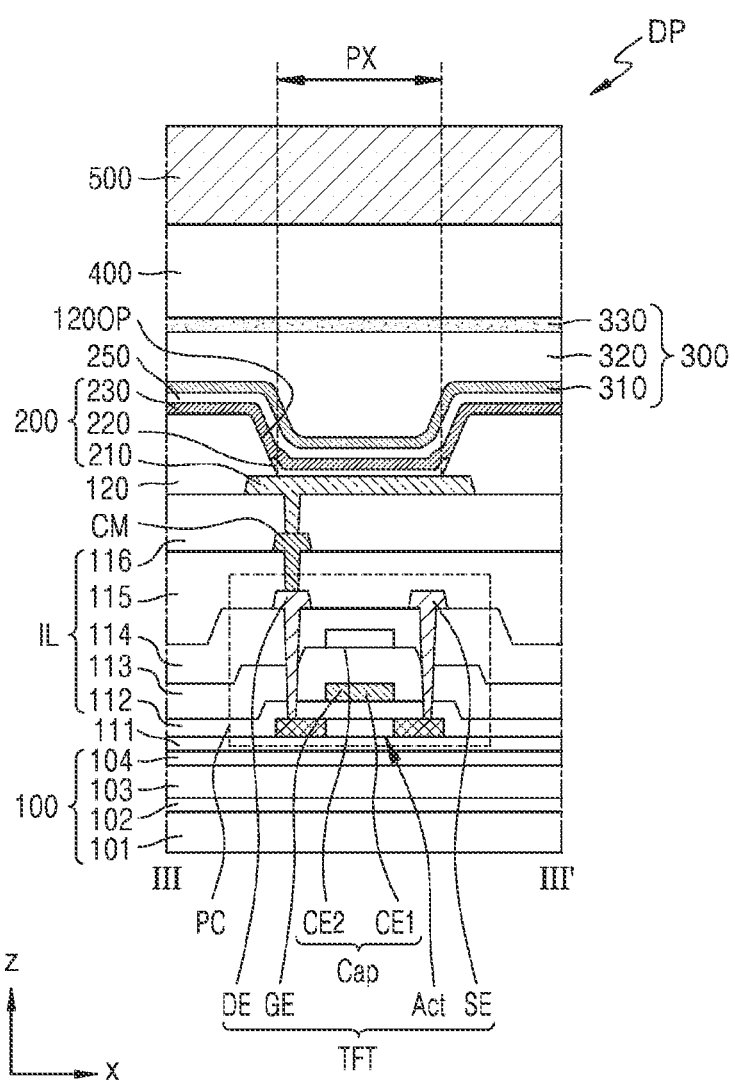
FIG. 3 is a cross-sectional view schematically illustrating a portion of a display panel provided in a display device of the electronic apparatus according to an embodiment.

FIG. 3 is a cross-sectional view schematically illustrating a portion of a display panel provided in a display device of the electronic apparatus according to an embodiment, and FIG. 3 may correspond to the cross-section of the display panel taken along line III-III' of FIG. 2.

Referring to FIG. 3, the display panel DP may include a substrate 100. In an embodiment, the substrate 100 may have a multi-layer structure including a base layer having a polymer resin, and an organic layer. For example, the substrate 100 may include a first base layer 101, a first barrier layer 102, a second base layer 103, and a second barrier layer 104, which are sequentially stacked on the substrate 100. The first base layer 101 and the second base layer 103 may include polyimide (PI), polyether sulfone (PES), polyarylate, polyetherimide (PEI), polyethylene naphthalate (PEN), polyethylene terephthalate (PET), polyphenylene sulfide (PPS), polycarbonate (PC), cellulose triacetate (TAO), or/and cellulose acetate propionate (CAP). The first barrier layer 102 and the second barrier layer 104 may include an inorganic insulating material such as silicon oxide, silicon oxynitride, and/or silicon nitride. The substrate 100 may be flexible.

A buffer layer 111 may be arranged on the substrate 100. The buffer layer 111 may reduce or block penetration of foreign substances, moisture or external air from the lower portion of the substrate 100 and may provide a flat surface to the substrate 100. The buffer layer 111 may include an inorganic insulating material such as silicon oxide, silicon oxynitride, or silicon nitride and may have a single layer or multi-layer structure including the material described above.

A pixel circuit PC may be arranged on the buffer layer 111. The pixel circuit PC may include thin film transistors (TFTs) and a storage capacitor Cap.

Each of the TFTs of the pixel circuit PC may include a semiconductor layer Act, a gate electrode GE overlapping a channel area of the semiconductor layer Act, and a source electrode SE and a drain electrode DE, which are connected to a source area and a drain area of the semiconductor layer Act, respectively.

The semiconductor layer Act of the buffer layer 111 may include polysilicon. Alternatively, the semiconductor layer Act may include amorphous silicon, oxide semiconductor, or organic semiconductor. The semiconductor layer Act may include a channel area, and a drain area and a source area, which are on both sides of the channel area, respectively. The drain area and the source area may be areas doped with impurities.

The gate electrode GE may include a low-resistance metal material. The gate electrode GE may include a conductive material including molybdenum (Mo), aluminum (Al), copper (Cu), titanium (Ti), and may have a multi-layer or single layer structure including the material described above.

A first gate insulating layer 112 may be between the semiconductor layer Act and the gate electrode GE. The first gate insulating layer 112 may include, for example, an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$); or zinc oxide ($ZnO_2$).

The second gate insulating layer 113 may be provided to cover the gate electrode GE. The second gate insulating layer 113 may include, similarly to the first gate insulating layer 112, an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

In an embodiment, the storage capacitor Cap may overlap the TFT. The storage capacitor Cap may include a first electrode CE1 and a second electrode CE2 that overlap each other. In some embodiments, the gate electrode GE of the TFT may include the first electrode CE1 of the storage capacitor Cap.

The second electrode CE2 of the storage capacitor Cap may be arranged on the second gate insulating layer 113. The second electrode CE2 may overlap the gate electrode GE thereunder. In this case, the gate electrode GE and the second electrode CE2 that overlap each other with the second gate insulating layer 113 therebetween may form the storage capacitor Cap. That is, the gate electrode GE overlapping the second electrode CE2 may function as the first electrode CE1 of the storage capacitor Cap. In another embodiment, the storage capacitor Cap may not overlap the TFT.

The second electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single layer or multi-layer structure with the above-described material.

An interlayer insulating layer 114 may cover the second electrode CE2. The interlayer insulating layer 114 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may have a single layer or multi-layer structure including the inorganic insulating material described above.

The drain electrode DE and the source electrode SE may be positioned on the interlayer insulating layer 114. The drain electrode DE and the source electrode SE may be connected to a drain area D and a source area S, respectively, through contact holes formed in insulating layers thereunder. The drain electrode DE and the source electrode SE may include materials having good conductivity. The drain electrode DE and the source electrode SE may include conductive materials including Mo, Al, Cu, and Ti, and may have a multi-layer or single layer structure including the above-described materials. In an embodiment, the drain electrode DE and the source electrode SE may have a multi-layer structure of Ti/Al/Ti.

A first planarization insulating layer 115 may cover the drain electrode DE and the source electrode SE. The first planarization insulating layer 115 may include an organic insulating material such as general-purpose polymer such as polymethylmethacrylate (PMMA) or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof.

A second planarization insulating layer 116 may be arranged on the first planarization insulating layer 115. The second planarization insulating layer 116 may include the same material as that of the first planarization insulating layer 115 and may include an organic insulating material such as general-purpose polymer such as polymethylmethacrylate (PMMA) or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof.

A light-emitting device 200 may be arranged on the second planarization insulating layer 116. In an embodiment, the light-emitting device 200 that is an organic light emitting diode (OLED) may include a stacked structure including a pixel electrode 210, an opposite electrode 230 arranged on the pixel electrode 210, and an intermediate layer 220 between the pixel electrode 210 and the opposite electrode 230, The light-emitting device 200 may emit light through an emission area and may emit, for example, red light, green light or blue light. Here, the emission area may be defined as a pixel PX.

The pixel electrode 210 may be arranged on the second planarization insulating layer 116. The pixel electrode 210 may be connected to a contact metal CM on the first planarization insulating layer 115 through a contact hole formed in the second planarization insulating layer 116. The contact metal CM may be electrically connected to the TFT of the pixel circuit PC through the contact hole formed in the first planarization insulating layer 115. Thus, the pixel electrode 210 may be electrically connected to the pixel circuit PC through the contact metal CM and may receive a driving current from the pixel circuit PC.

The pixel electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 210 may further include a layer formed of ITO, IZO, ZnO, or $In_2O_3$ on/under the above-described reflective layer. In another embodiment, the pixel electrode 210 may have a three-layer structure of sequentially stacked ITO layer/Ag layer/ITO layer.

A pixel-defining layer 120 may be arranged on the pixel electrode 210. The pixel-defining layer 120 may include an opening 120OP that includes sidewalls exposing the central portion of the pixel electrode 210. The opening 120OP may define an emission area of light emitted from the OLED. The size/width of the opening 120OP may correspond to the size/width of the emission area. Thus, the size and/or width of the pixel PX may depend on the size and/or width of the opening 120OP of the pixel-defining layer 120.

The pixel-defining layer 120 may increase a distance between an edge of the pixel electrode 210 and the opposite electrode 230 above the pixel electrode 210, thereby preventing an arc etc. from occurring in the edge of the pixel electrode 210. The pixel-defining layer 120 may be formed through a method such as spin coating, by using an organic insulating material such as polyimide, polyamide, acryl resin, benzocyclobutene, hexamethyldiSL-1 oxane (HMDSO), and phenol resin.

The intermediate layer 220 may include an emission layer arranged to overlap the pixel electrode 210. The emission layer may include a polymer or small molecular weight organic material that emits light of a certain color. Alternatively, the emission layer may include an inorganic light-emitting material or quantum dots.

In an embodiment, the intermediate layer 220 may include a first functional layer (not shown) and a second functional layer (not shown) arranged under and on the emission layer, respectively. The first functional layer that is an element arranged under the emission layer may include, for example, a hole transport layer (HTL), or an HTL and a hole injection layer (HIL). The second functional layer that is an element arranged on the emission layer may include an electron transport layer (ETL) and/or an electron injection layer (EIL). The first functional layer and/or the second functional layer may be a common layer formed to entirely cover the substrate 100, like the opposite electrode 230 to be described later.

The opposite electrode 230 may be arranged on the pixel electrode 210 and may overlap the pixel electrode 210. The opposite electrode 230 may include a conductive material having a small work function. For example, the opposite electrode 230 may include a (semi-)transparent layer including Ag, Mg, Al, Pt, Pd, Au, nickel (Ni), Nd, Ir, Cr, lithium (Li), calcium (Ca), or an alloy thereof. Alternatively, the opposite electrode 230 may further include a layer such as ITO, IZO, ZnO, or $In_2O_3$ on the (semi-)transparent layer including the materials described above. In an example, the opposite electrode 230 may be integrally formed to entirely cover the display area (see DA of FIG. 2).

According to an embodiment, a capping layer 250 may be provided on the light-emitting devices 200. The capping layer 250 may include an inorganic insulating material such as silicon nitride and/or an organic insulating material. When the capping layer 250 includes an organic insulating material, the capping layer 250 may include an organic insulating material such as a triamine derivative, a carbazole biphenyl derivative, an arylenediamine derivative, tri(8-hydroxyquinolinato)aluminum (Alq3), acrylic, polyimide, or polyamide.

An encapsulation layer 300 may be arranged on the capping layer 250. The encapsulation layer 300 may overlap the light-emitting devices 200. As described above, the encapsulation layer 300 may include at least one inorganic encapsulation layer and at least one organic encapsulation layer. In an embodiment, FIG. 3 illustrates that the encapsulation layer 300 includes a stacked structure of a first inorganic encapsulation layer 310, an organic encapsulation layer 320, and a second inorganic encapsulation layer 330.

The first inorganic encapsulation layer 310 and the second inorganic encapsulation layer 330 may include one or more inorganic materials among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate. The organic encapsulation layer 320 may be formed by curing a monomer or applying a polymer. The organic encapsulation layer 320 may be transparent.

A touch sensing layer 400 including sensing electrodes and trace lines electrically connected to the sensing electrodes may be arranged on the encapsulation layer 300. The touch sensing layer 400 may obtain coordinate information according to an external input, for example, a touch event. The touch sensing layer 400 may sense the external input by using a self-capacitance method or a mutual capacitance method.

An optical functional layer 500 may be arranged on the touch sensing layer 400. The optical functional layer 500 may reduce reflectivity of light (external light) incident toward the display panel DP from the outside and/or may increase color purity of light emitting from the display panel DP.

In an embodiment, the optical functional layer 500 may include a retarder and/or a polarizer. The retarder may be of a film type or liquid crystal coating type and may include a λ/2 retarder or a λ/4 retarder. The polarizer may also be of a film type or liquid crystal coating type. The polarizer of the film type may include an elongation-type synthetic resin film, and the polarizer of the liquid crystal coating type may include liquid crystals arranged in a certain arrangement. The retarder and the polarizer may further include a protective film.

In another embodiment, the optical functional layer 500 may include a destructive interference structure. The destructive interference structure may include a first reflective layer and a second reflective layer, which are arranged on different layers. First reflected light and second reflected light respectively reflected from the first reflective layer and the second reflective layer may destructively interfere and thus, the reflectivity of external light may be reduced.

Here, the display panel DP includes an OLED as the light-emitting devices 200. However, the display panel DP is not limited thereto. In another embodiment, the display panel DP may be a display panel including an inorganic light-emitting diode, i.e., an inorganic light emitting display panel. In another embodiment, the display panel DP may be a quantum dot light emitting display panel. Hereinafter, for convenience of explanation, a display panel DP including an OLED will be described.

Figure 4:
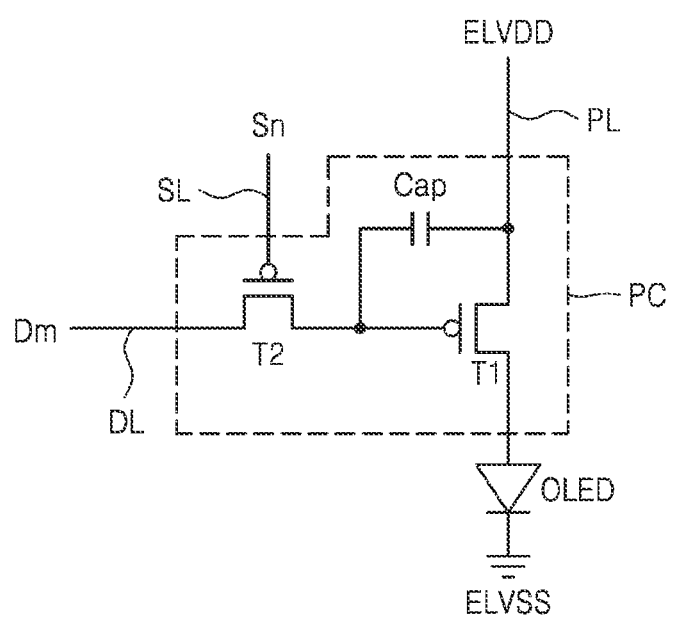
FIG. 4 is an equivalent circuit diagram of any pixel circuit provided in the display panel of the electronic apparatus according to an embodiment.

FIG. 4 is an equivalent circuit diagram of any pixel circuit provided in a display panel of an electronic apparatus according to an embodiment.

Referring to FIG. 4, the display panel (see DP of FIG. 3) may include a pixel circuit PC and an OLED that emits light by receiving a driving current from the pixel circuit PC.

The pixel circuit PC may include a plurality of TFTs and a storage capacitor. According to an embodiment, as shown in FIG. 4, the pixel circuit PC may include a first TFT T1, a second TFT T2, and a storage capacitor Cap. In an example, the first TFT T1 may be a driving TFT, and the second TFT T2 may be a switching TFT. The second TFT T2 may be connected to a scan line SL and a data line DL and may transmit a data signal Dm input through the data line DL to the first TFT T1 according to a scan signal Sn input through the scan line SL.

The storage capacitor Cap may be connected to the second TFT T2 and a driving voltage line PL and may store a voltage corresponding to a difference between a driving voltage ELVDD applied to the driving voltage line PL and an arbitrary voltage applied to the second TFT T2.

The first TFT T1 may be connected to the driving voltage line PL and the storage capacitor Cap and may control a driving current flowing from the driving voltage line PL to the OLED in response to a value of the voltage stored hi the storage capacitor Cap. An opposite electrode of the OLED may be connected to a common voltage ELVSS. The OLED may emit light having certain luminance according to the driving current, thereby displaying an image.

In FIG. 4, the pixel circuit PC includes two TFTs and one storage capacitor. However, embodiments are not limited thereto. For example, the pixel circuit PC may include three or more TFTs and/or two or more storage capacitors. In an embodiment, the pixel circuit PC may also include seven TFTs and one storage capacitor. The number of TFTs and the number of storage capacitors may be variously changed according to the design of the pixel circuit PC. However, hereinafter, for convenience of explanation, a case where the pixel circuit PC includes two TFTs and one storage capacitor, will be described, FIG. 5 is a cross-sectional view schematically illustrating a portion of an electronic apparatus according to an embodiment.

Figure 5:
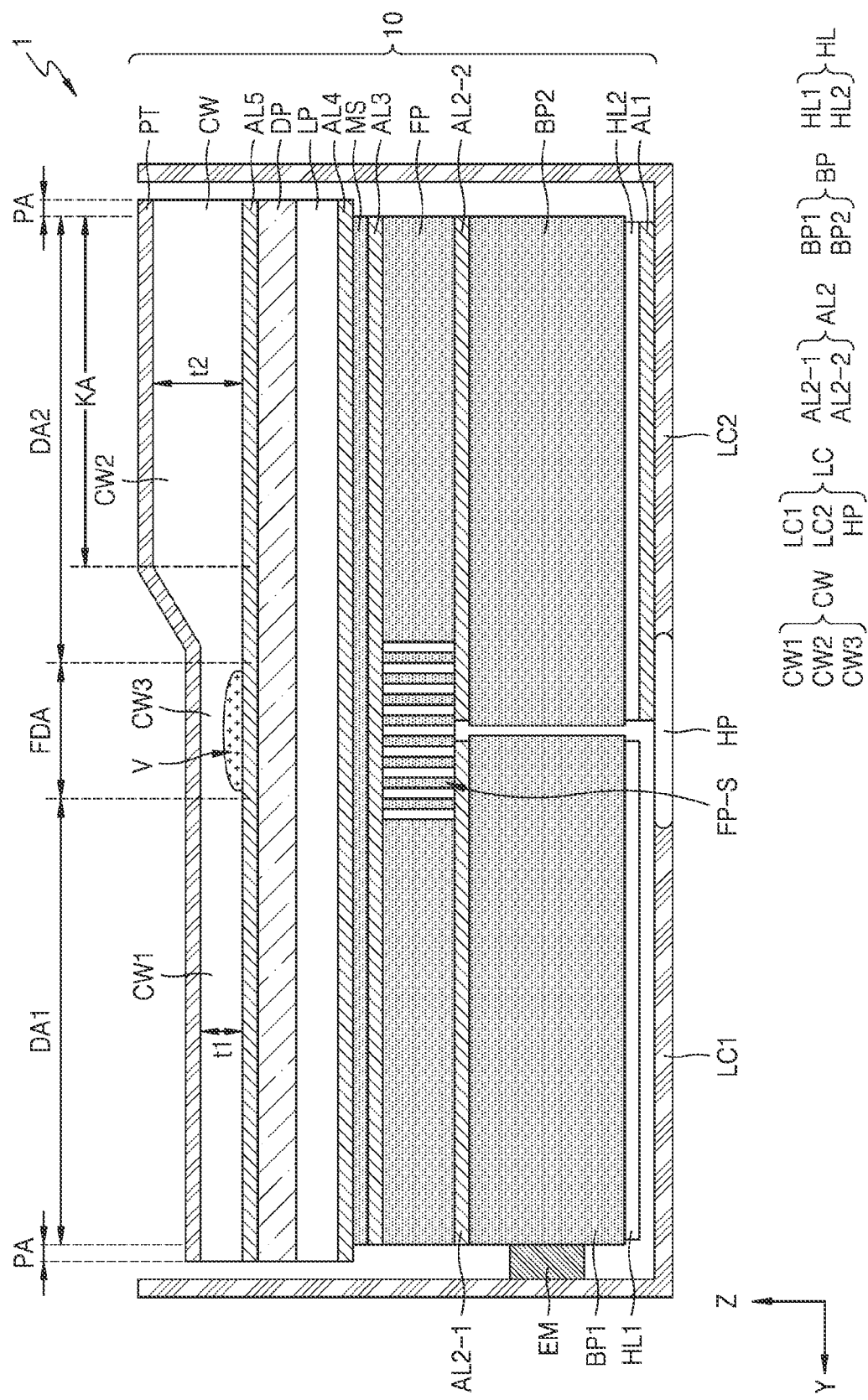
FIG. 5 is a cross-sectional view schematically illustrating a portion of an electronic apparatus according to another embodiment.

Referring to FIG. 5, an electronic apparatus 1 may include a lower cover LC and a display device 10.

The lower cover LC may be arranged on a lower portion of the display device 10, In an embodiment, the lower cover LC may be configured to accommodate the display device 10. For example, the lower cover LC may cover a lower surface of the display device 10 as well as a side surface of the display device 10. The lower cover LC may include a first part LC1, a second part LC2, and a hinge portion HP therebetween, as described above. A redundant description therewith will be omitted.

The lower cover LC may support the display device 10 and may provide rigidity to the display device 10. To this end, the lower cover LC may include a significantly rigid material and may include a metal material such as aluminum, magnesium, or the like. In an embodiment, the lower cover LC may include a metal material having high thermal conductivity, such as aluminum, so as to effectively dissipate heat transferred from the display device 10 to the outside.

In an embodiment, the display device 10 may include a display panel DP and a cover window OW. The display panel DP may include a first display area DA1, a second display area DA2 including a keyboard area KA, and a folding display area FDA between the first display area DA1 and the second display area DA2, and a redundant description therewith will be omitted.

The display panel DP may provide an image through a front surface thereof. That is, a plurality of pixels (see PX of FIG. 3) may be arranged on the front surface of the display panel DP so that a display area DA may be formed. The display panel DP may be folded about a folding axis FAX. Thus, the display panel DP may be folded so that a portion of the front surface of the display panel DP may be folded to face another portion thereof. That is, the display panel DP may be an folding-in-type foldable display panel.

The cover window CW may be arranged on the front surface of the display panel DR The cover window CW may have high transmittance so as to transmit light emitted from the display device 10 and may have a small thickness so as to decrease the weight of the electronic apparatus 1, Also, the cover window CW may have strong strength and hardness so as to protect the display device 10 from external shock. The cover window CW may include, for example, glass or plastic. In an embodiment, the cover window CW may be ultra thin-film tempered glass having increased strength by using a method such as chemical strengthening or thermal strengthening.

The cover window CW may include a first section CW1 and a second section CW2, which respectively overlap the first display area DA1 and the second display area DA2 on a plane. Also, the cover window CW may overlap the folding display area FDA on the plane and may include a third section CW3 between the first section CW1 and the second section CW2. The third section CW3 may extend in one direction and for example, may extend in parallel to the folding axis FAX.

In an embodiment, a thickness t1 of the first section CW1 and a thickness t2 of the second section CW2 of the cover window CW may be different from each other. For example, the thickness t2 of the second section CW2 may be greater than the thickness t1 of the first section CW1. In an embodiment, the thickness 11 of the first section CW1 may be 30 μm to 100 μm, and the thickness t2 of the second section CW2 may be 100 μm to 500 μm. In an embodiment, the thickness t2 of the second section CW2 may have a maximum value in an area overlapping the keyboard area KA. Thus, the strength the second display area DA2, preferably, the strength in the keyboard area KA may be increased. Because the keyboard area KA is an area to which pressure is frequently applied by the user, an area overlapping the keyboard area KA includes the cover window CW having a greater thickness than another area, so that the display device 10 under the cover window CW may be effectively protected.

A thickness t3 of the third section CW3 may be less than the thickness t1 of the first section CW1 and the thickness t2 of the second section CW2. The lower surface of the third section CW3 may not be on the same plane as a lower surface of each of the first section CW1 and the second section CW2. Thus, as shown in FIG. 5, a certain space V may be formed between the display panel DP and the cover window OW. When viewed in an extension direction of the folding axis FAX, the cross-sectional shape of the space V may be a rectangle such as a rectangle or a trapezoid, a rectangle with round corners, a partial shape of a semicircle, or a partial shape of an ellipse, as shown in FIG. 5.

The space V may be a space sealed by the display panel DP and the cover window CW. In order to prevent light emitted from the display panel DP or light incident on the display panel DP from being refracted or scattered by the space V and be recognized by the user, in an embodiment, the space V may have a refractive index similar to that of the cover window CW and may be filled with a transparent material. For example, an acryl-based resin, an epoxy-based resin, polyimide, and polyethylene may be filled in the space V. In another embodiment, the cross-sectional shape of the space ✓ may be formed as a rectangle with round corners or a partial shape of a semicircle or an ellipse, so that refraction or scattering of light by the space V may be decreased and thus, recognition of the space V by the user may be decreased.

In some embodiments, the display device 10 may further include an external protective layer PT arranged on the cover window CW. The external protective layer PT may entirely cover the upper surface of the cover window CW. The external protective layer PT may absorb external shock and may prevent the cover window CW from being scratched. The external protective layer PT may include a polymer resin such as polyimide or polyethylene, or a urethane-based material.

In an embodiment, the display device 10 may further include a base plate BP, a foldable plate FP, a metal sheet MS, and a lower protective layer LP.

The base plate BP may be arranged on a rear surface of the display panel DP and may be between the display panel DP and the lower cover LC. The base plate BP may support the display panel DP and may provide rigidity to the display device 10.

In an embodiment, the base plate BP may include a first base plate BP1 and a second base plate BP2, which are spaced apart from each other on the plane. The first base plate BP1 may overlap the first display area DA1 on the plane, and the second base plate BP2 may overlap the second display area DA2 on the plane. In an embodiment, a separation area between the first base plate BP1 and the second base plate BP2 may overlap the folding display area FDA. When the display device 10 is folded, the first base plate BP1 and the second base plate BP2 may not interfere with each other.

In an embodiment, the first base plate BP1 and the second base plate BP2 may include a metal material that is sufficiently rigid, for example, a metal material such as Cu, Ni, Ag, Al, Mg, Ti, or the like. In some embodiments, the first base plate BP1 may include alloy steel such as carbon steel or stainless steel. In some embodiments, the second base plate BP2 may include carbon fiber having excellent rigidity and elasticity. Thus, shock resistance in the keyboard area KA of the display device 10 may be increased.

In an embodiment, the first base plate BP1 may be provided to be slidable with respect to the lower cover LC, and the second base plate BP2 may be fixedly adhered to the lower cover LC. In an embodiment, the first base plate BP1 may be spaced apart from the lower cover LC and may be slidable without friction, whereas, the second base plate BP2 may be attached to the lower cover LC through a first adhesion layer AL1. The first adhesive layer AL1 may be, for example, a pressure sensitive adhesive (PSA) or an optically clear adhesive (OCA).

When the electronic apparatus 1 is folded, the display device 10 may receive a compressive force and a tensile force. In this case, when the display device 10 is entirely constrained in the lower cover LC, internal stress caused by the compressive force and the tensile force may be formed in the display device 10. Such internal stress may damage the display device 10. However, in an embodiment of the present disclosure, a portion of the display device 10, for example, a portion corresponding to the first display area DA1, may not be constrained with respect to the lower cover LC but may be configured to be slidable so that internal stress that may occur in the display device 10 when the electronic apparatus 1 is folded and damage to the display device 10 may be decreased and durability of the display device 10 may be increased.

In some embodiments, the display device 10 may further include an elastic member EM connecting between the lower cover LC and the first base plate BP1 of the base plate BR The elastic member EM may be compressed or stretched in a direction (for example, the y-direction) crossing the folding axis FAX, and may include, for example, a spring. One side of the elastic member EM may be connected to the side of the first base plate BP1, and the other side of the elastic member EM may be connected to one side surface of the lower cover LC facing the side surface of the first base plate BP1. When the electronic apparatus 1 is folded or unfolded, the electronic apparatus 1 may support the first base plate BP1 of the display device 10 to stably slide with respect to the lower cover LC.

The display device 10 may include a foldable plate FP, a metal sheet MS, and a lower protective layer LP, which are arranged on the base plate BP. The foldable plate FP, the metal sheet MS, and the lower protective layer LP may be between the base plate BP and the display panel DP.

The foldable plate FP may support the display panel DP together with the base plate BR The foldable plate FP may include a metal material that is sufficiently rigid and may include a metal material, for example, Cu, Ni, Ag, Al, Mg, Ti, or the like. In some embodiments, the foldable plate FP may include alloy steel such as carbon steel or stainless steel.

The foldable plate FP may be arranged to overlap all of the first display area DA1, the second display area DA2, and the folding display area FDA of the display panel DP. The foldable plate FP may be folded together with the display panel DP. To this end, the foldable plate FP may include a folding structure FP-S. The shape or length of the folding structure FP-S may be changed when the display device 10 is folded. The folding structure FP-S may include a concave-convex shape including a plurality of through grooves, links pivotably connected to each other, or the like. The folding structure FR-S may extend along the folding axis FAX, and the foldable plate FP may be formed so that both sides of the foldable plate FP may be symmetrical with respect to each other based on the folding structure FP-S.

The metal sheet MS may be arranged on the foldable plate FP. The metal sheet MS may supplement the rigidity of the display device 10 and may transfer heat generated from the display panel DR The metal sheet MS may include a metal material having sufficient rigidity and excellent thermal conductivity and may include a metal material, for example, Cu, Ni, Ag, Al, Mg, Ti, or the like. In some embodiments, the metal sheet MS may include alloy steel such as carbon steel or stainless steel.

The lower protective layer LP may be arranged on the metal sheet MS. In an embodiment, the lower protective layer LP may be in contact with the rear surface of the display panel DP. The lower protective layer LP may protect the display panel DP from the outside. For example, the lower protective layer LP may absorb physical shock from the outside and may block foreign substances or moisture from penetrating into the display panel DR In an embodiment, the lower protective layer LP may include an organic insulating material such as polyethylene terephthalate (PET), polyimide (PI), urethane acrylate, or the like.

In some embodiments, the lower protective layer LP may further include a material that blocks ultraviolet rays (UV). For example, the lower protective layer LP may include a base resin, a UV absorber, and inorganic particles. The UV absorber and the inorganic particles may be dispersed in the base resin. In an example, the base resin may be an acrylate-based resin and may be, for example, urethane acrylate. However, embodiments are not limited thereto, and the base resin that is optically clear and may disperse the UV absorber and the inorganic particles, may be used in the lower protective layer LP without limitations. In an example, the UV absorber may include at least one among benzotriazol, benzophenone, salicylic acid, salicylate, cyanoacrylate, cinnamate, oxanilide, polystyrene, azomethine, and triazine compounds.

The display device 10 may include adhesive layers between two elements among elements of the display device 10. The display device 10 may include, for example, a second adhesive layer AL2 between the base plate BP and the foldable plate FP, a third adhesive layer AL3 between the foldable plate FP and the metal sheet MS, and a fourth adhesive layer AL4 between the metal sheet MS and the lower protective layer LP. Here, the second adhesive layer AL2 may include a 2-1st adhesive layer AL2-1 arranged on the first base plate BP1, and a 2-2nd adhesive layer AL2-2 arranged on the second base plate BP2, and the 2-1st adhesive layer AL2-1 and the 2-2nd adhesive layer AL2-2 may be spaced apart from each other on the plane. Although not shown in FIG. 5, a separate adhesive layer may be arranged between the display panel DP and the lower protective layer LP. Also, the display device 10 may be attached to the cover window CW through a fifth adhesive layer AL5. Each of the second through fifth adhesive layers AL2, AL3, AL4, and AL5 may be an OCA or a PSA.

The display device 10 may further include a heat dissipation layer HL. The heat dissipation layer HL may be arranged on a lower surface of the base plate BP. For example, a first heat dissipation layer HL1 and a second heat dissipation layer HL2 may be respectively arranged on lower surfaces of the first base plate BP1 and the second base plate BP2. Although not shown in FIG. 5, an adhesive layer may be between the heat dissipation layer HL and the base plate BP.

The heat dissipation layer HL may effectively dissipate heat generated from the display panel DP to the outside. For example, the heat dissipation layer HL may include a metal thin layer such as Cu, Ni, ferrite, or Ag that has excellent thermal conductivity and may shield electromagnetic waves, and/or may include graphite or carbon nanotubes.

Figure 6A:
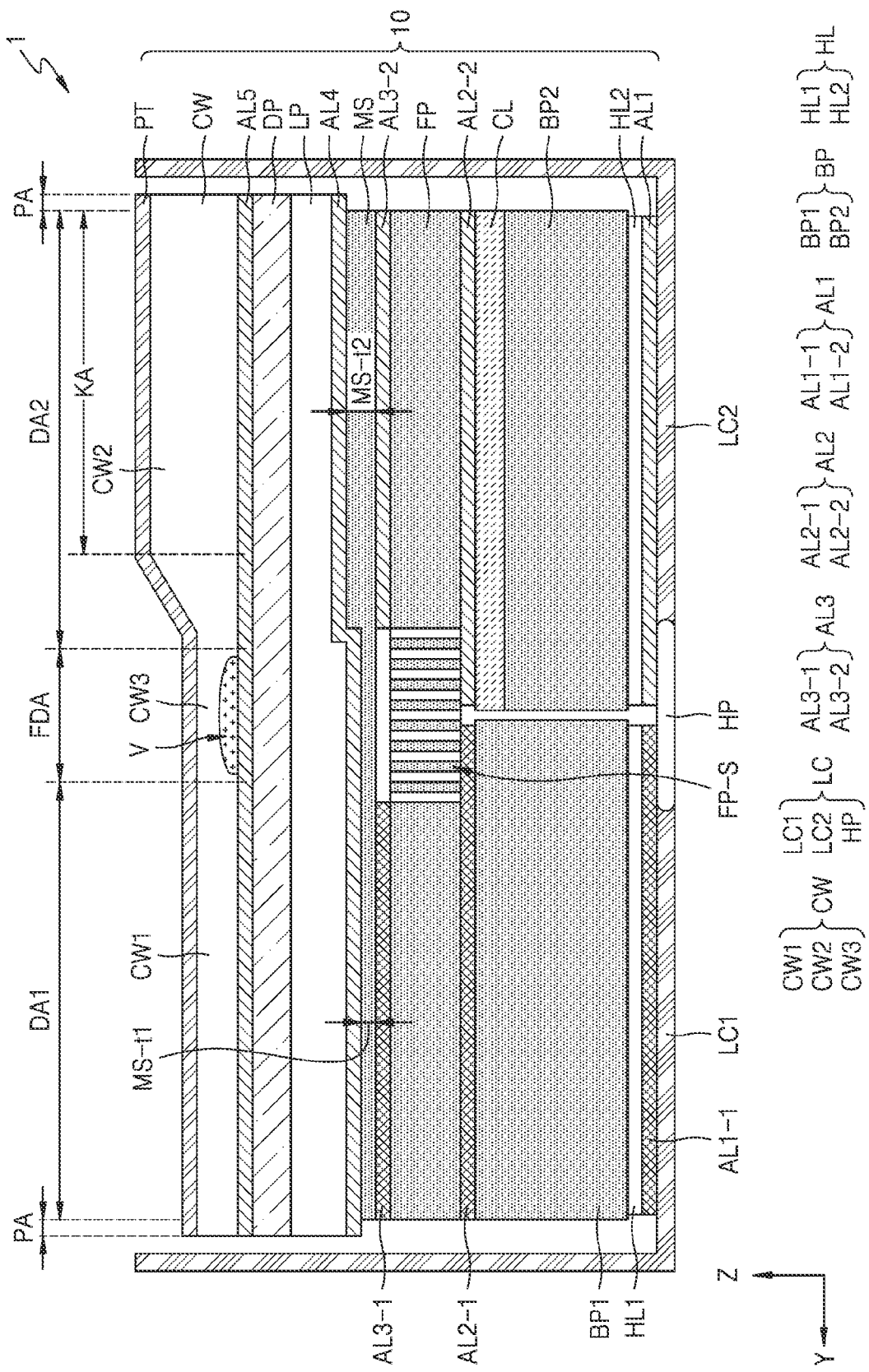
FIGS. 6A and 6B are cross-sectional views schematically illustrating a portion of an electronic apparatus according to embodiments.
Figure 6B:
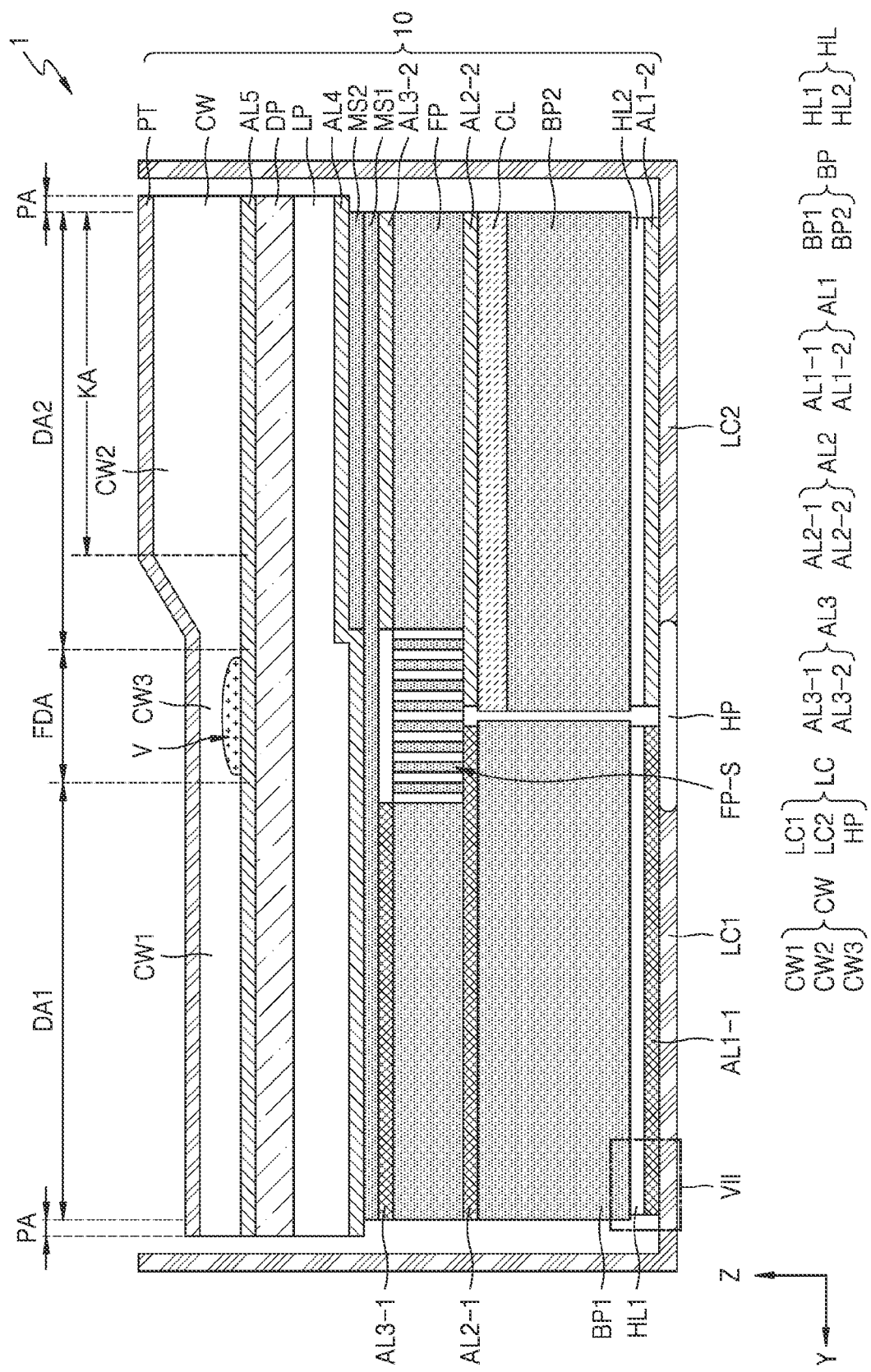

FIGS. 6A and 6B are cross-sectional views schematically illustrating a portion of an electronic apparatus according to embodiments. Contents overlapping those described above with reference to FIG. 5 will be omitted, and differences will be mainly described below.

Referring to FIGS. 6A and 6B, the display device 10 of the electronic apparatus 1 may further a cushion layer CL between the base plate BP and the foldable plate FR The cushion layer CL may overlap the second display area DA2 on the plane. Preferably, the cushion layer CL may be arranged to overlap at least the keyboard area KA of the second display area DA2 on the plane. The cushion layer CL may be arranged on an upper surface of the second base plate BP2.

The cushion layer CL may prevent or decrease damage to the display panel DP by absorbing an external shock, Preferably, the cushion layer CL may be provided to absorb a shock of the display panel DP in the keyboard area KA to which pressure is frequently applied by the user. The cushion layer CL may include a material having elasticity. For example, the cushion layer CL may include a foam formed of a polymer resin, such as polyurethane, polyethylene, polycarbonate, polypropylene, polyolefin, or the like. Alternatively, the cushion layer CL may include a material having elasticity, such as rubber, a urethane-based material or a sponge formed by foam molding of an acryl-based material. However, the above-described material is just an example, and the cushion layer CL may include a material having excellent compressive stress and excellent shock and vibration absorption.

According to an embodiment, the metal sheet MS of the display device 10 may have a greater thickness in the keyboard area KA of the second display area DA2. For example, as shown in FIG. 6A, a portion of the metal sheet MS overlapping the keyboard area KA of the second display area DA2 may be provided thicker than a portion of the metal sheet MS overlapping the first display area DA1. That is, a thickness MS-t2 of the portion of the metal sheet MS overlapping the keyboard area KA may be greater than a thickness MS-t1 of the portion of the metal sheet MS overlapping the first display area DA1.

Alternatively, as shown in FIG. 68, the metal sheet MS of the display device 10 may include a first metal sheet MS1 entirely overlapping the display panel DP, and a second metal sheet MS2 overlapping at least the keyboard area KA of the second display area DA2, The second metal sheet MS2 may be arranged on one surface of the first metal sheet MS1. FIG. 6B illustrates that the second metal sheet MS2 is arranged on an upper surface of the first metal sheet MS1. However, the second metal sheet MS2 may also be arranged on a lower surface of the first metal sheet MS1. In this way, the metal sheet MS may have a multi-layer structure to be thicker than in the keyboard area KA of the second display area DA2.

As described above, the metal sheet MS may be formed thicker in the keyboard area KA of the second display rea DA2 so that the rigidity of the display device 10 in the keyboard area KA may be further increased.

Adhesive layers may have an elongation property or stretchability that is increased by an external force. The elongation property denotes an ability to be stretched and return to its original dimension without damage. In an embodiment, adhesive layers arranged to overlap the first display area DA1 have a higher elongation rate than an elongation rate of adhesive layers arranged to overlap the second display area DA2. Herein, the elongation rate is obtained by calculating a deformation rate of an object until broken during a tension test thereof with a reference to a state before the test as a percentage, and herein, as the percentage is the higher, flexibility is increased. For example, the 2-1st adhesive layer AL2-1 that is arranged on a lower surface of the foldable plate FP and overlaps the first display area DA1 may have a higher elongation rate than an elongation rate of the 2-2nd adhesive layer AL2-2 that is arranged on a lower surface of the foldable plate FP and overlaps the second display area DA2. Similarly, a 3-1st adhesive layer AL3-1 that is arranged on an upper surface of the foldable plate FP and overlaps the first display area DA1 may have a higher elongation rate than an elongation rate of a 3-2nd adhesive layer AL3-2 that is arranged on an upper surface of the foldable plate FP and overlaps the second display area DA2.

In some additional embodiments, the 1-1st adhesive layer AL1-1 may be further provided on a lower surface of the first base plate BP1, and a 1-2nd adhesive layer AL1-2 may be provided on a lower surface of the second base plate BP2.

Here, the 1-1st adhesive layer AL1-1 may have a higher elongation rate than an elongation rate of the 1-2nd adhesive layer AL1-2.

In this way, the adhesive layers AL1-1, AL2-1, and AL3-1 arranged to overlap the first display area DA1 may have a relatively high elongation rate so that internal stress that may occur in each of components of the display device 10 when the display device 10 is folded. In this regard, it will be further described with reference to FIGS. 7A and 7B below.

Figure 7A:
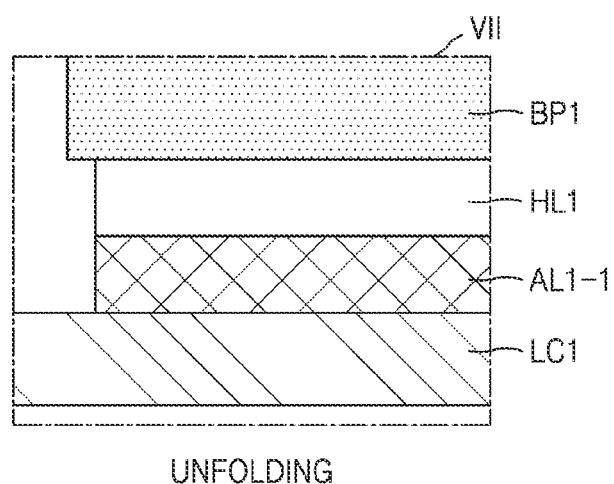
FIGS. 7A and 7B are enlarged cross-sectional views schematically illustrating a portion of an electronic apparatus according to another embodiment.
Figure 7B:
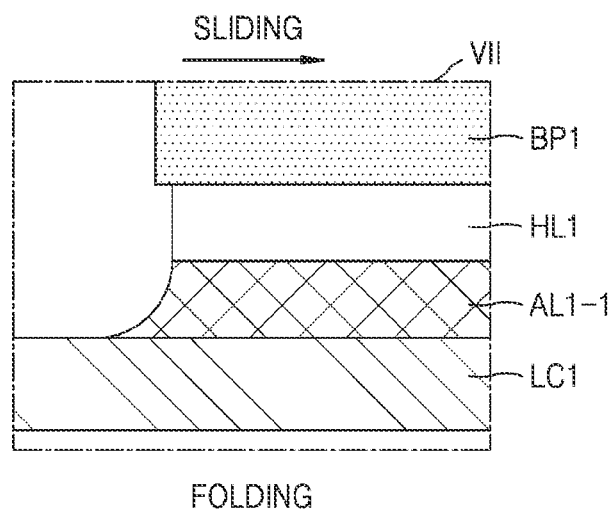

FIGS. 7A and 7B are enlarged cross-sectional views schematically illustrating a portion of an electronic apparatus according to another embodiment. FIGS. 7A and 7B correspond to portion VII of the electronic apparatus of FIG. 6B, FIG. 7A illustrates a case where the electronic apparatus is in an unfolded state, and FIG. 7B illustrates a case where the electronic apparatus is in a folded state.

Referring to FIGS. 7A and 7B, when the electronic apparatus (see 1 of FIG. 6B) is folded, components of the display device (see 10 of FIG. 6B), for example, the first base plate BP1 and the first heat dissipation layer HL1 may receive a tensile force, and thus, may be slightly displaced with respect to the first lower cover LC. For example, the first base plate BP1 and the first heat dissipation layer HL1 may slide in one direction, and a sliding direction may be a direction that is a direction parallel to one surface of the first lower cover LC and crosses the folding axis (see FAX of FIG. 1A).

Because the 1-1st adhesive AL1-1 has a relatively high elongation rate, the 1-1st adhesive layer AL1-1 may be easily extended according to sliding of the first base plate BP1 and the first heat dissipation layer HL1. Thus, the strain of the first base plate BP1 and the first heat dissipation layer HL1 may be minimized. Thus, internal stress that may occur in the first base plate BP1 and the first heat dissipation layer HL1 may be reduced.

This principle may also be applied to the 2-1st adhesive layer (see AL2-1 of FIG. 6B) between the first base plate BP1 and the foldable plate (see FP of FIG. 6B) and the 3-1st adhesive layer (see AL3-1 of FIG. 6B) between the foldable plate FP and the metal sheet (see MS of FIG. 6B). That is, when the display device 10 is folded, the 2-1st adhesive layer AL2-1 and the 3-1st adhesive layer AL3-1 may be easily extended. Thus, the strain and internal stress of each of the first base plate BP1, the foldable plate FP, and the metal sheet MS may be reduced.

Figure 8:
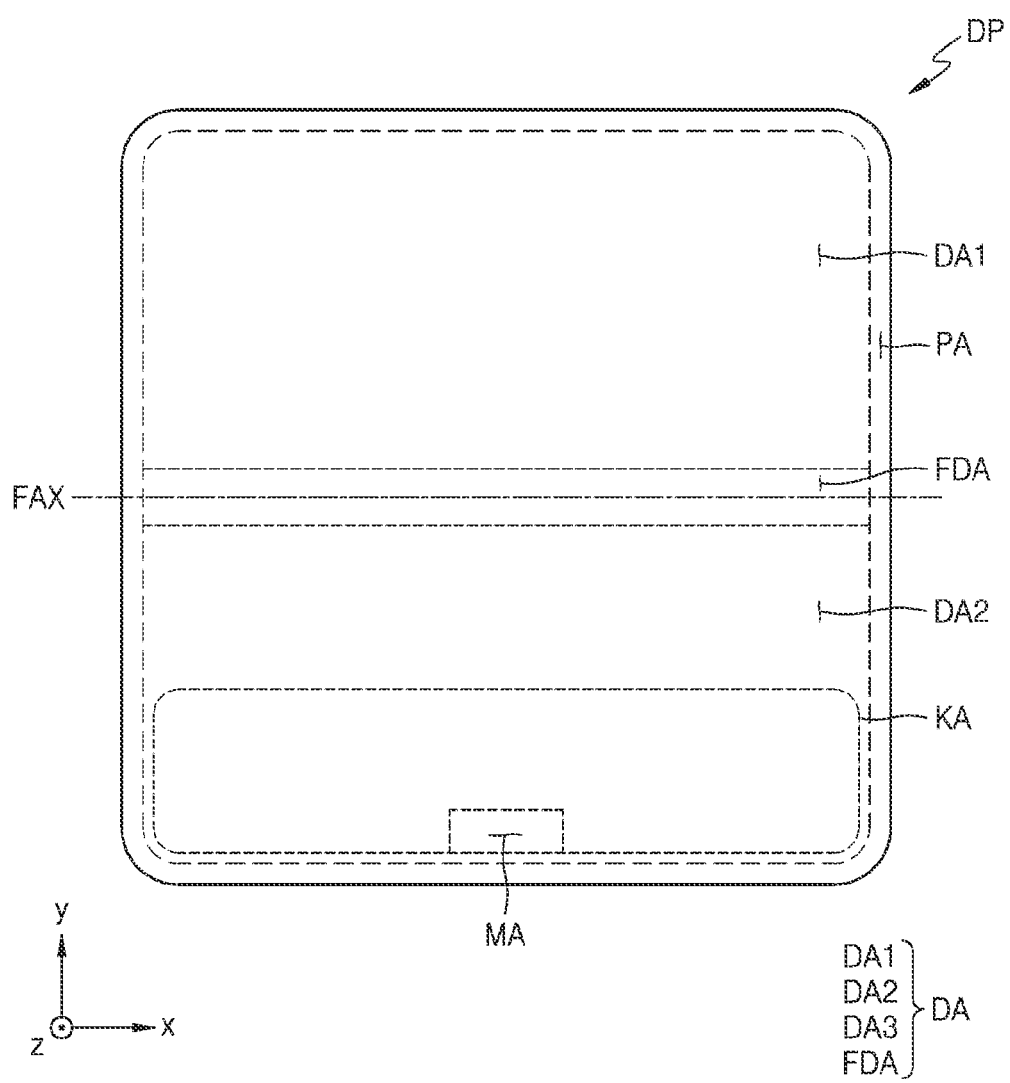
FIG. 8 is a plan view schematically illustrating a display panel provided in a display device of an electronic apparatus according to another embodiment.

FIG. 8 is a plan view schematically illustrating a display panel provided in a display device of an electronic apparatus according to another embodiment. Contents overlapping those described above with reference to FIG. 2 will be omitted, and differences will be mainly described below.

Referring to FIG. 8, the display panel DP may further include a mouse area MA. The mouse area MA may be provided as a portion of the second display area DA2, for example. The mouse area MA may be arranged to overlap the keyboard area KA inside the keyboard area KA, as shown in FIG. 8. In another example, the mouse area MA may be arranged to be adjacent to the keyboard area KA outside the keyboard area KA. The mouse area MA may be, for example, an area for accommodating a mouse movement and a click input, similar to a touch pad of a laptop computer.

The mouse area MA may have a rectangular shape on the plane, as shown in FIG. 8. However, embodiments are not limited thereto. The mouse area MA may have various shapes such as a polygon, a polygon with round corners, a circle, an ellipse, and the like.

Figure 9:
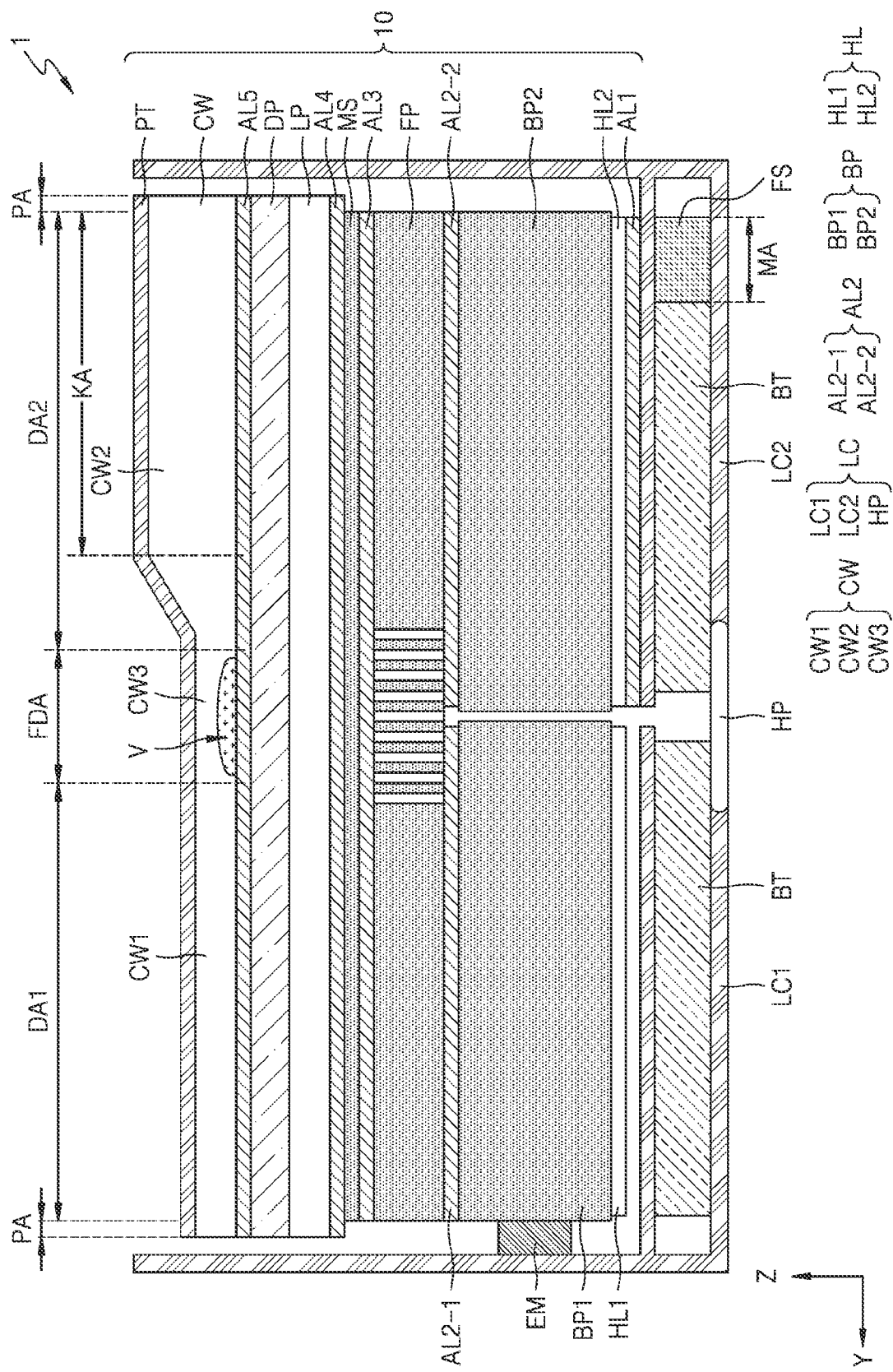
FIG. 9 is a cross-sectional view schematically illustrating a portion of an electronic apparatus according to another embodiment.

FIG. 9 is a cross-sectional view schematically illustrating a portion of an electronic apparatus according to another embodiment. Contents overlapping those described above with reference to FIG. 5 will be omitted, and differences will be mainly described below.

Referring to FIG. 9, the electronic apparatus 1 may further include a battery module BT and a force sensor FS, which are built into the lower cover LC. The battery module BT may be arranged on a lower portion of the display device 10. The battery module BT may be electrically connected to various components provided in the display device 10 and the electronic apparatus 1. The battery module BT may be an external power supply device for supplying power for driving the electronic apparatus 1 including the display device 10 and the components.

The force sensor FS may be arranged on the lower portion of the display device 10 and may be arranged to overlap a portion of the second display area DA1 on the plane. For example, the force sensor FS may be arranged in the mouse area MA described above with reference to FIG. 8 and may be arranged to be adjacent to one end of the second display area DA2 on the plane. The force sensor FS may sense a touch force by the user in the mouse area MA and thus, may accommodate a movement and a click input. In an embodiment, the force sensor FS may sense a touch force using a quantum tunneling composite (QTC) method or a strain gauge method.

Figure 10:
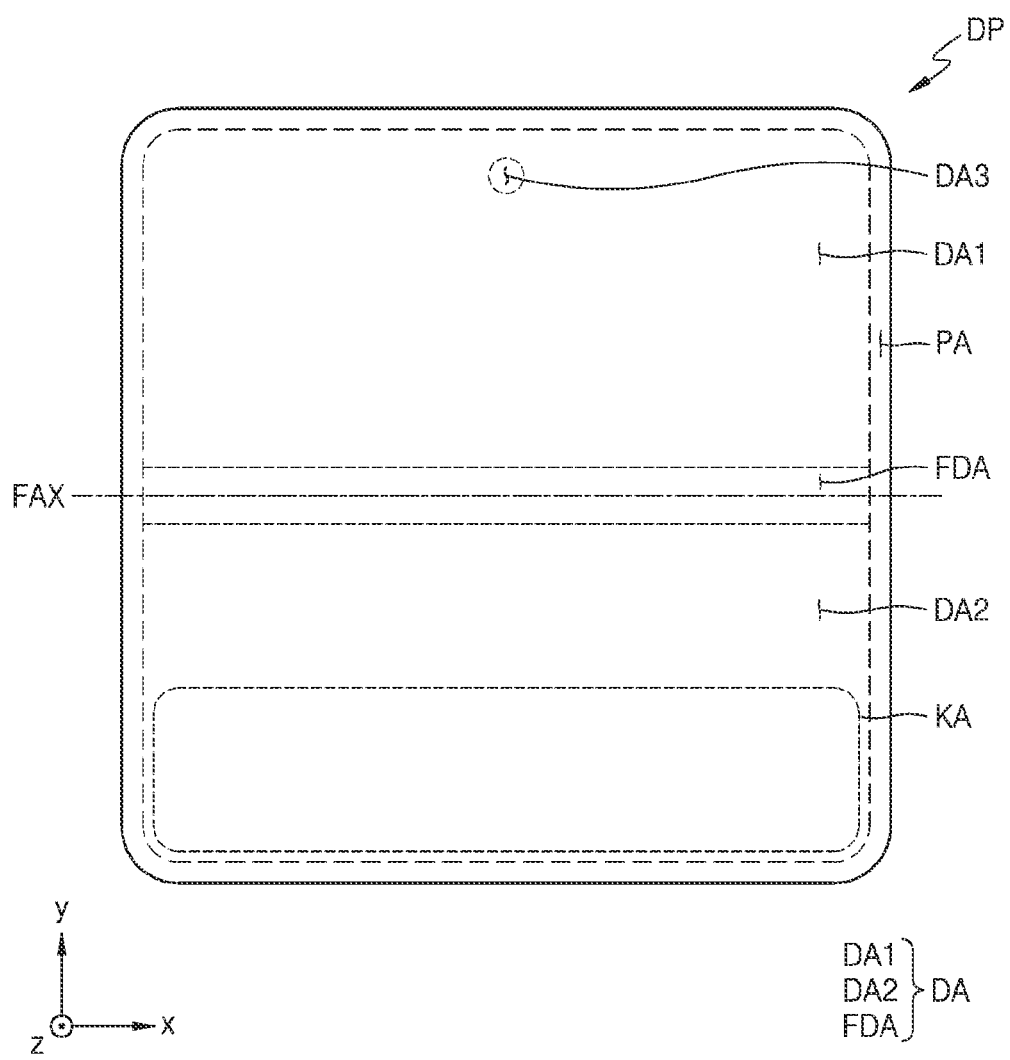
FIG. 10 is a plan view schematically illustrating a display panel provided in a display device of an electronic apparatus according to another embodiment.

FIG. 10 is a plan view schematically illustrating a display panel provided in a display device of an electronic apparatus according to another embodiment. Contents overlapping those described above with reference to FIG. 2 will be omitted, and differences will be mainly described below.

Referring to FIG. 10, the display area DA of the display panel DP may further include a third display area DA3. The third display area DA3 may be at least partially surrounded by the first display area DA1 on the plane. For example, the third display area DA3 may be arranged inside the first display area DA1 or may be arranged on one side of the first display area DA1. As shown in FIG. 10, the third display area DA3 may be entirely surrounded by the first display area DA1. In some embodiments, the third display area DA3 may be partially surrounded by the first display area DA1. For example, the third display area DA3 may be positioned at one corner of the first display area DA1 and may be partially surrounded by the first display area DA1.

The ratio of the third display area DA3 with respect to the display area DA may be less than the ratio of the first display area DA1 with respect to the display area DA. The display panel DP may include one third display area DA3 or two or more third display areas DA3, as shown in FIG. 10.

The third display area DA3 may have a circular shape on the plane, as shown in FIG. 10. However, embodiments are not limited thereto. The third display area DA3 may have various shapes such as a polygon, a polygon with round corners, an ellipse, and the like.

The third display area DA3 may include a plurality of pixels and a transmissive area between the plurality of pixels. The transmissive area that is an area through which light may transmit, may be an area in which no pixels are arranged. That is, the array of pixels of the third display area DA3 may be different from the array of pixels of the first display area DA1 and the second display area DA2. The third display area DA3 may have a lower resolution than the first display area DA1 and the second display area DA2.

An image provided in the third display area DA3 may be a portion of an image provided by the entire display area DA, or an image independent from images provided by the first display area DA1 and the second display area DA2.

Figure 11A:
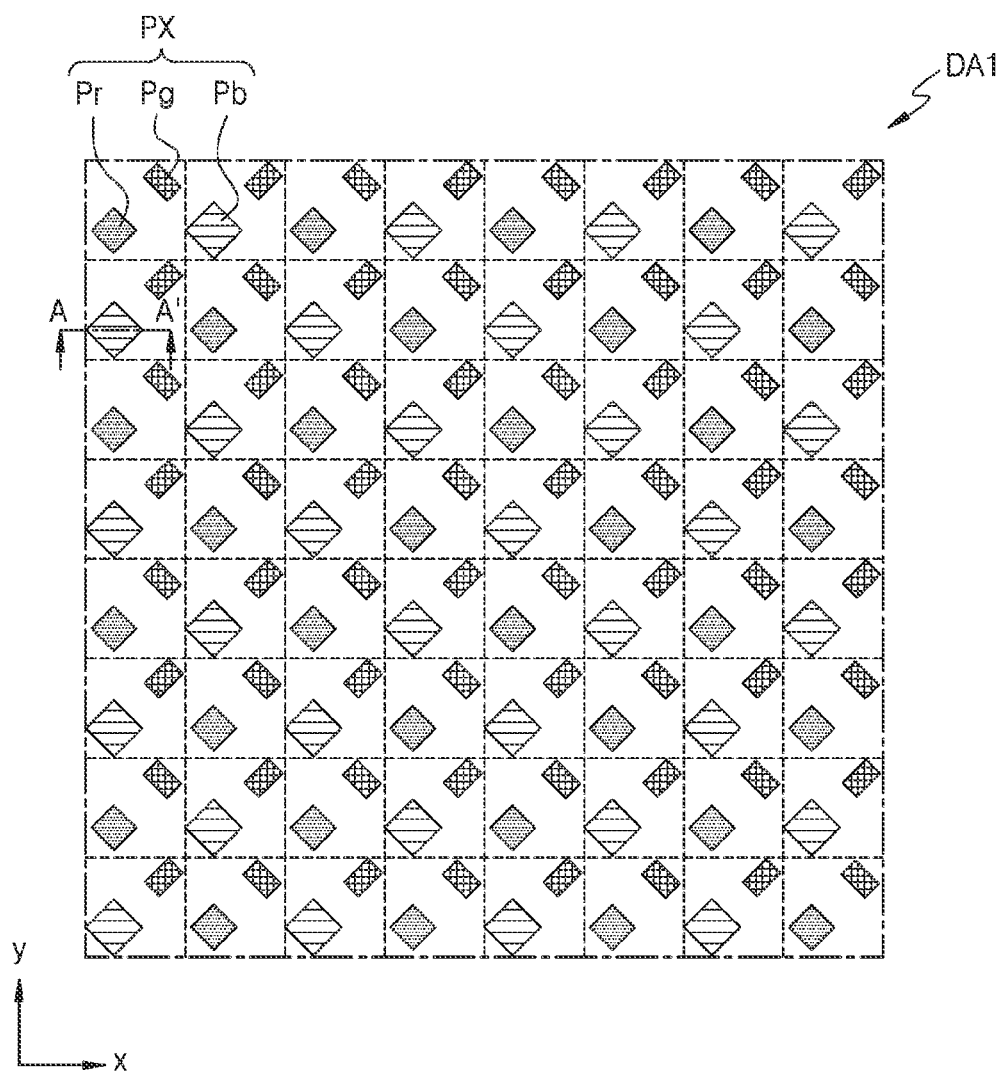
FIGS. 11A and 11B are plan views schematically illustrating a portion of each of a first display area and a third display area of a display panel provided in an electronic apparatus according to another embodiment.
Figure 11B:
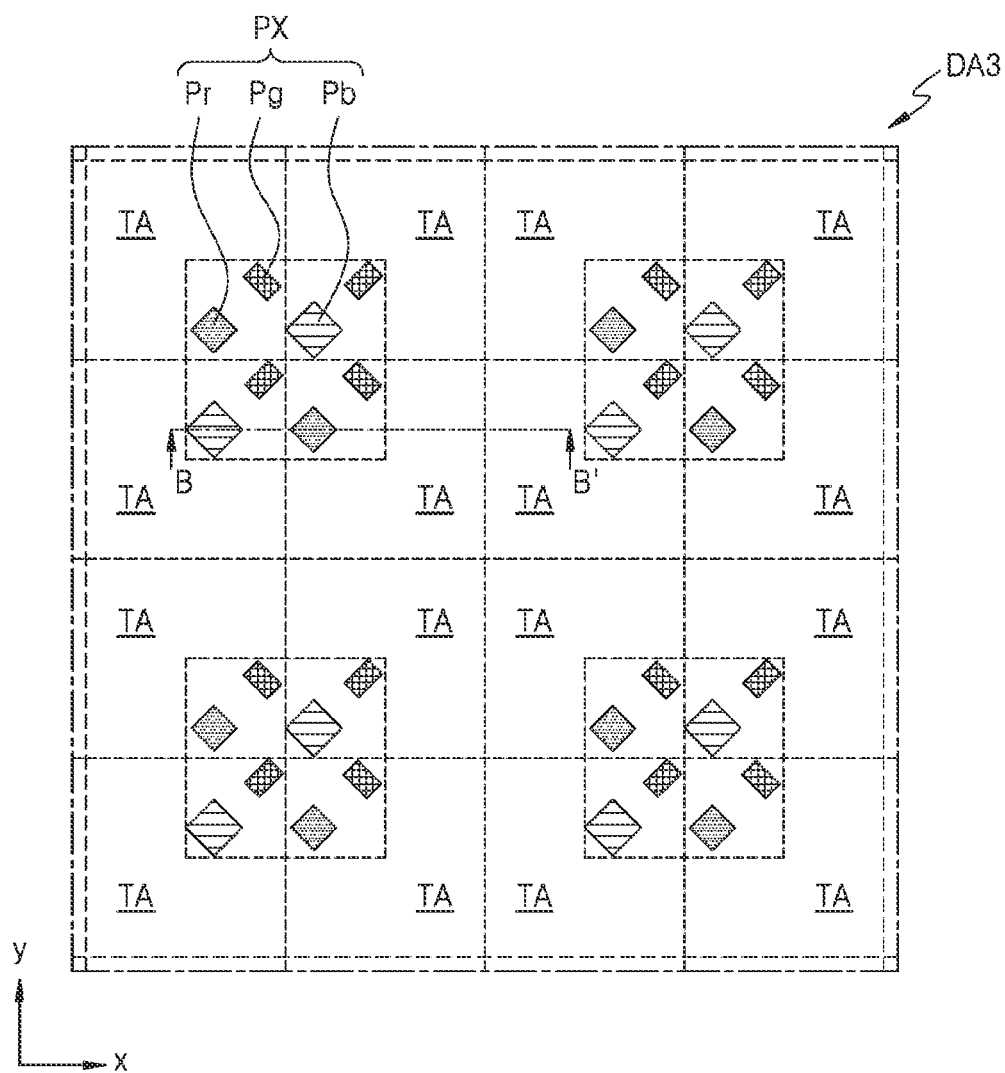

FIGS. 11A and 11B are plan views schematically illustrating a portion of each of a first display area and a third display area of a display panel provided in an electronic apparatus according to another embodiment.

Referring to FIG. 11A, a plurality of pixels PX may be arranged in the first display area DA1. The plurality of pixels PX may include a red pixel Pr, a green pixel Pg, and a blue pixel Pb. In some embodiments, as shown in FIG. 11A, the red pixel Pr, the green pixel Pg, and the blue pixel Pb may be arranged in a PENTILE® matrix. In another embodiment, the red pixel Pr, the green pixel Pg, and the blue pixel Pb may be arranged in a stripe type.

The red pixel Pr, the green pixel Pg, and the blue pixel Pb may have different sizes (or widths). For example, the blue pixel Pb may be greater than the red pixel Pr and the green pixel Pg, and the red pixel Pr may be greater than the green pixel Pg. In some embodiments, the green pixel Pg may have a rectangular shape, and adjacent green pixels Pg may extend in different directions.

Referring to FIG. 11B, the plurality of pixels PX may be arranged in the third display area DA3. The pixels PX may include a red pixel Pr, a green pixel Pg, and a blue pixel Pb. The third display area DA3 may include transmissive areas TA. The transmissive areas TA in the third display area DA3 may be adjacent to the pixels PX, For example, the pixels PX may include at least two pixels PX that are spaced apart from each other with the transmissive area TA therebetween. Because the third display area DA3 includes the transmissive areas TA, the number of pixels PX per the same area in the third display area DA3 may be less than the number of pixels PX per the same area in the first display area DA1.

In an embodiment, FIG. 11B illustrates that eight pixels PX form one group and adjacent groups are arranged with the transmissive area TA therebetween. Also, the one group may be at least partially surrounded by four transmissive areas TA formed in an shape. Embodiments are not limited thereto. The number of pixels PX included in the one group may be modified and designed according to the resolution of the third display area DA3. Also, the planar shape of the transmissive area TA around the one group may be variously modified and designed.

Figure 12:
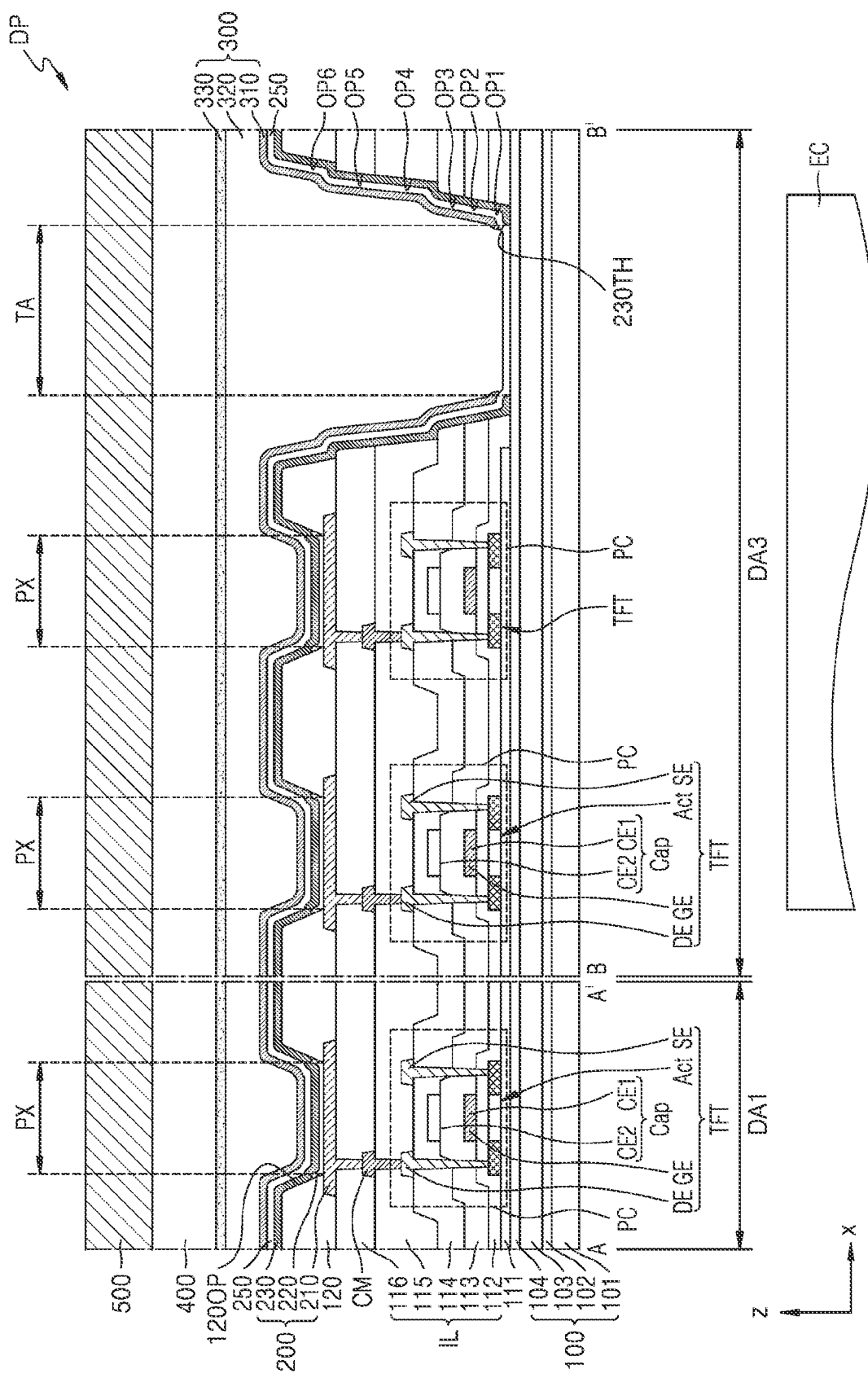
FIG. 12 is a cross-sectional view schematically illustrating a portion of a display panel provided in an electronic apparatus according to another embodiment.

FIG. 12 is a cross-sectional view schematically illustrating a portion of a display panel provided in an electronic apparatus according to another embodiment. FIG. 12 may correspond to the cross-section of the display panel taken along line A-A' of FIG. 11A and the cross-section of the display panel taken along line B-B' of FIG. 11B.

A stacked structure in the first display area DA1 of the display panel DP shown in FIG. 12 may be the same as described above with reference to FIG. 3. Those components that are the same or are in correspondence with the components described with reference to FIG. 3 are rendered the same reference numeral, and a redundant description therewith is omitted.

Referring to FIG. 12, the stacked structure in the third display area DA3 of the display panel DP may be the same as the stacked structure in the first display area DA1 except for the stacked structure in the transmissive area TA. The third display area DA3 may include a transmissive area TA. The transmissive area TA that is an area through which light may transmit may be an area in which no pixels PX are arranged.

In an embodiment, in the third display area DA3, each of insulating layers IL on the substrate 100 may include an opening corresponding to the transmissive area TA. For example, the first gate insulating layer 112, the second gate insulating layer 113, the interlayer insulating layer 114, the first planarization insulating layer 115, and the second planarization insulating layer 116 may include first through fifth openings OP1, OP2, OP3, OP4, and OP5, respectively, which are positioned in the transmissive area TA and overlap each other. Also, the pixel-defining layer 120 may include a sixth opening OP6 overlapping the transmissive area TA, and the opposite electrode 230 may include a through hole 230TH overlapping the transmissive area TA. The sixth opening OP6 and the through hole 230TH may overlap the first through fifth openings OP1, OP2, OP3, OP4, and OP5. Thus, light transmittance in the transmissive area TA may be increased.

In another embodiment, the insulating layers IL may be positioned in the transmissive area TA, and only the pixel-defining layer 120 and the opposite electrode 230 may also include the sixth opening OP6 and the through hole 230TH, which respectively overlap the transmissive area TA.

An electronic component EC may be arranged to overlap the third display area DA3 of the display panel DP. The electronic component EC may be an electronic element using light or sound. For example, the electronic element may be a sensor that measures distance, such as a proximity sensor, a sensor that recognizes a part of the user's body (e.g., fingerprint, iris, face, etc.), a small lamp that outputs light, or an image sensor (e.g., camera) that captures an image, or the like. The electronic element using light may use light of various wavelength bands, such as visible light, infrared light, UV light, and the like. The electronic element using sound may use ultrasonic waves or sound of another frequency band. Light and/or sound emitted from the electronic component EC or directed toward the electronic component EC may be transmitted through the transmissive area TA of the third display area DA3.

Figure 13:
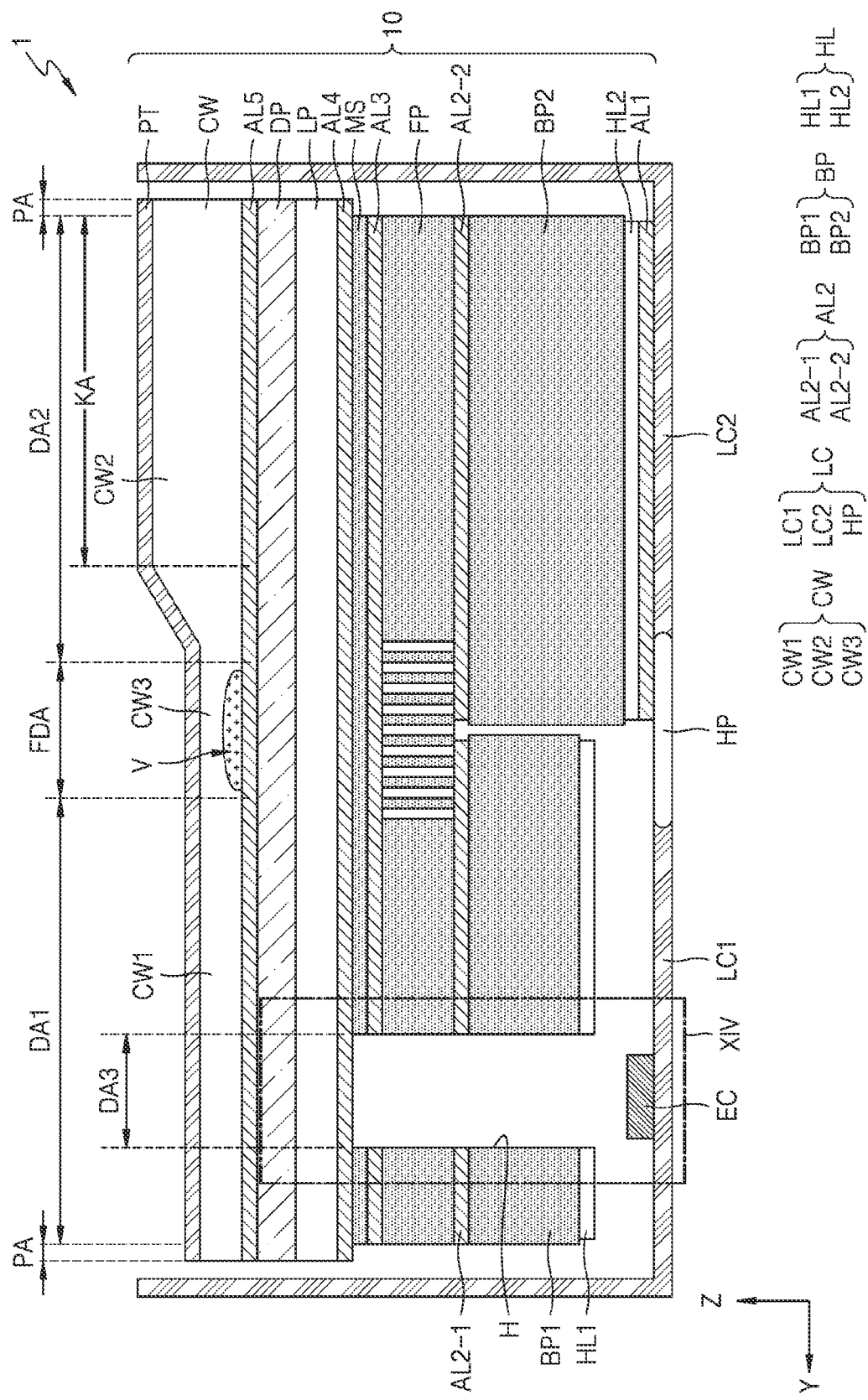
FIG. 13 is a cross-sectional view schematically illustrating a portion of an electronic apparatus according to another embodiment.

FIG. 13 is a cross-sectional view schematically illustrating a portion of an electronic apparatus according to another embodiment. Contents overlapping those described above with reference to FIG. 5 will be omitted, and differences will be mainly described below.

Referring to FIG. 13, the display panel DP of the electronic apparatus 1 may include a third display area DA3 that is at least partially surrounded by the first display area DA1 on the plane. The third display area DA3 is the same as described above with reference to FIGS. 10 through 12 and thus, a detailed description thereof will be omitted.

The electronic apparatus 1 may further include an electronic component EC that is arranged to overlap the third display area DA3. The electronic component EC may be built into the lower cover LC and may be between the display device 10 and the lower cover LC. Light and/or sound emitted from the electronic component EC or directed toward the electronic component EC may pass through the display device 10 in the third display area DA3. Thus, the electronic apparatus 1 including the third display area DA3 for providing an image and performing various functions by using the electronic component EC may be provided.

In an embodiment, the display device 10 may include a hole H overlapping the electronic component EC. The hole H may be formed by removing a portion of the display device 10 along a thickness direction of the display device 10. The hole H of the display device 10 may entirely overlap the third display area DA3 on the plane. By providing the hole H, the display device 10 may increase transmittance of the light and/or sound in the third display area DA3.

Figure 14A:
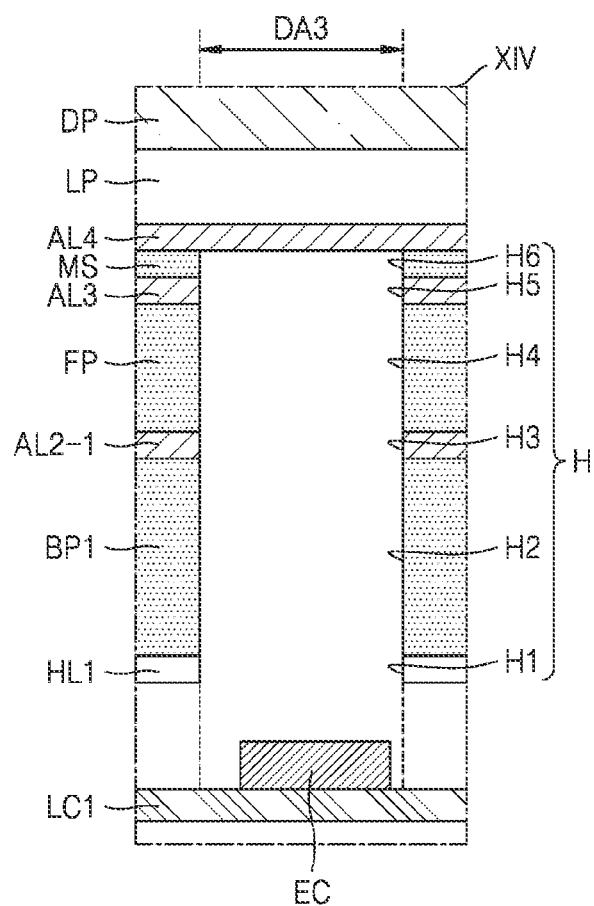
FIGS. 14A and 14B are enlarged cross-sectional views schematically illustrating a portion of an electronic apparatus according to another embodiment.
Figure 14B:
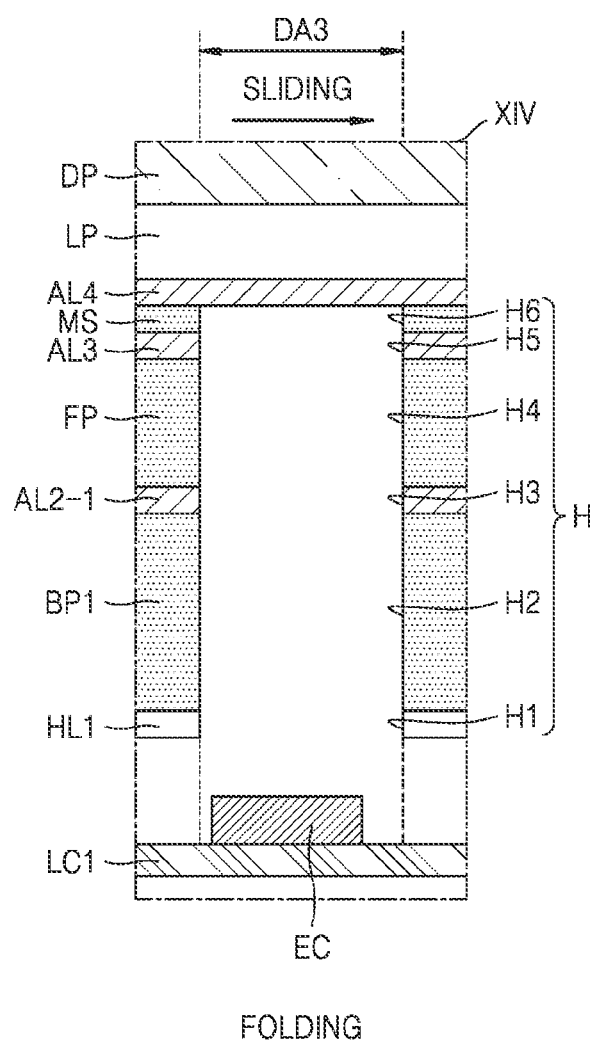

FIGS. 14A and 14B are enlarged cross-sectional views schematically illustrating a portion of an electronic apparatus according to another embodiment. FIGS. 14A and 14B may correspond to portion XIV of the electronic apparatus 1 of FIG. 13, wherein FIG. 14A illustrates that the electronic apparatus 1 is in an unfolded state, and FIG. 14B illustrates that the electronic apparatus 1 is in a folded state.

Referring to FIGS. 14A and 14B, some components of the display device (see 10 of FIG. 13) may include holes overlapping the third display area DA3. For example, the first heat dissipation layer HL1, the first base plate BP1, the 2-1st adhesive layer AL2-1, the foldable plate FP, the third adhesive layer AL3, and the metal sheet MS of the display device 10 may include first through sixth holes H1, H2, H3, H4, H5, and H6. The first through sixth holes H1, H2, H3, H4, H5, and H6 may constitute the hole H of the display device 10.

In some embodiments, the lower protective layer LP may not have a hole overlapping the third display area DA3 so as to protect the display panel DP on the lower protective layer LP. However, this is just an example, and if necessary, the lower protective layer LP may have a hole overlapping the third display area DA3. In this case, the fifth adhesive layer AL4 may have a hole overlapping the third display area DA3.

In an embodiment, the electronic component EC may entirely overlap the third display area DA3 and the hole H on the plane when the display device 10 is folded as well as when it is unfolded. That is, as shown in FIG. 14A, the electronic component EC even in the unfolded state may align with the third display area DA3 and the hole H, and as shown in FIG. 14B, the electronic component EC even in the folded state may align with the third display area DA3 and the hole H.

To this end, considering that the relative positions of the third display area DA3 of the display device 10 and the electronic component EC change when the display device 10 is folded and unfolded, the positions and sizes (i.e., an occupied area and/or width on the plane) of the third display area DA3 and the hole H may be determined. The sizes of the third display area DA3 and the hole H may be greater than the size of the electronic component EC. In this way, the electronic component EC overlaps the third display area DA3 and the hole of the display device 10 so that degradation of the performance of the electronic component EC may be decreased.

Figure 15A:
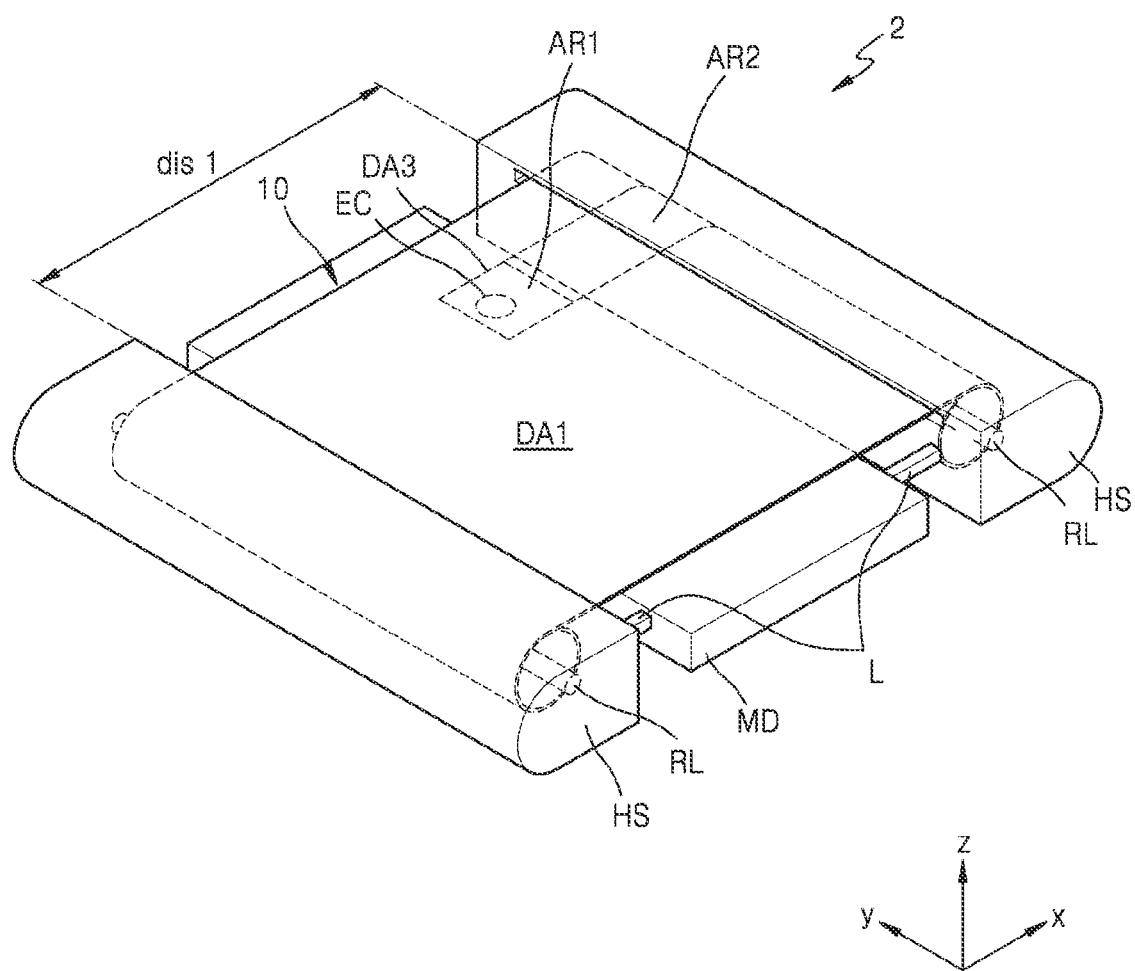
FIGS. 15A and 15B are perspective views schematically illustrating an electronic apparatus according to another embodiment.
Figure 15B:
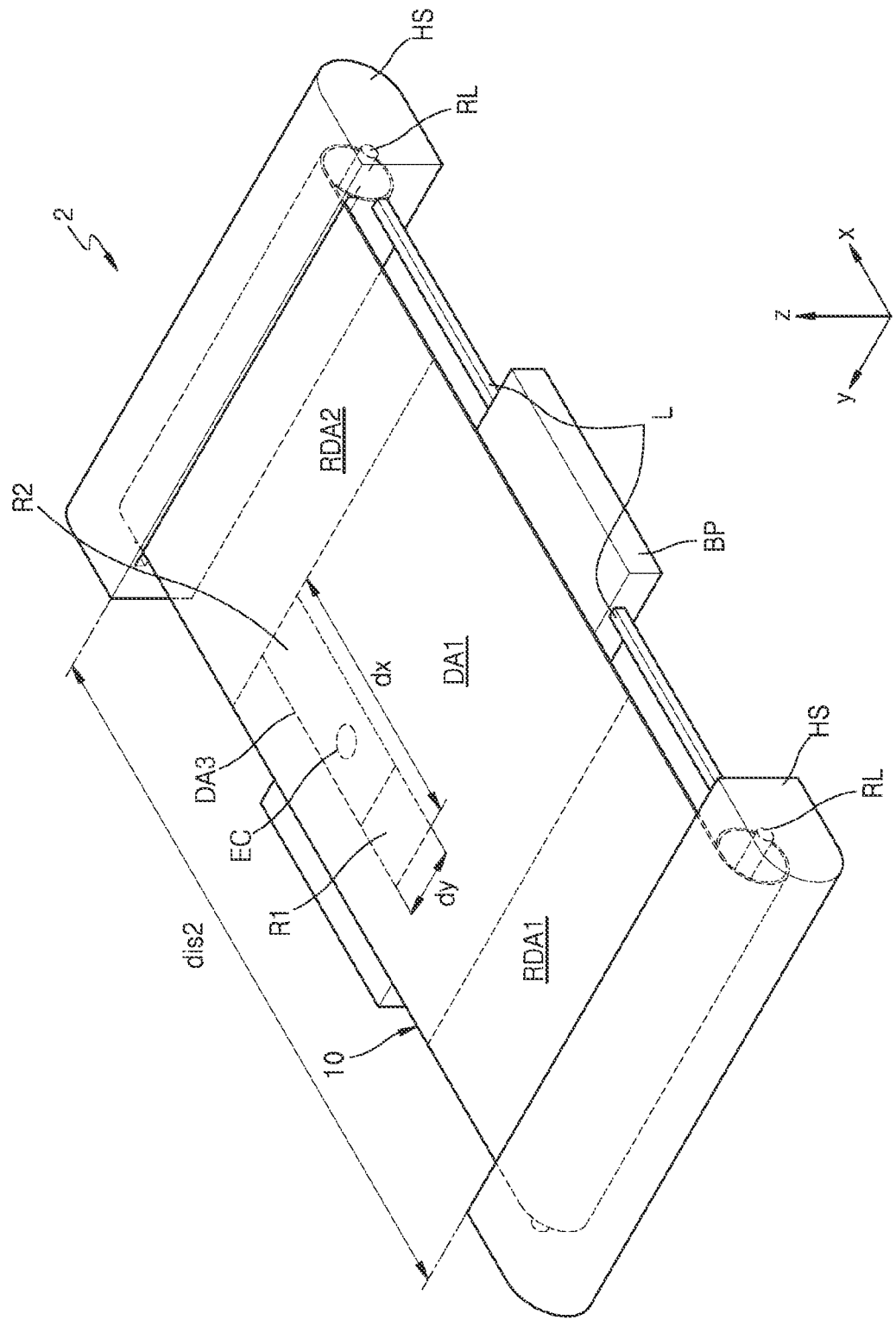
Figure 16:
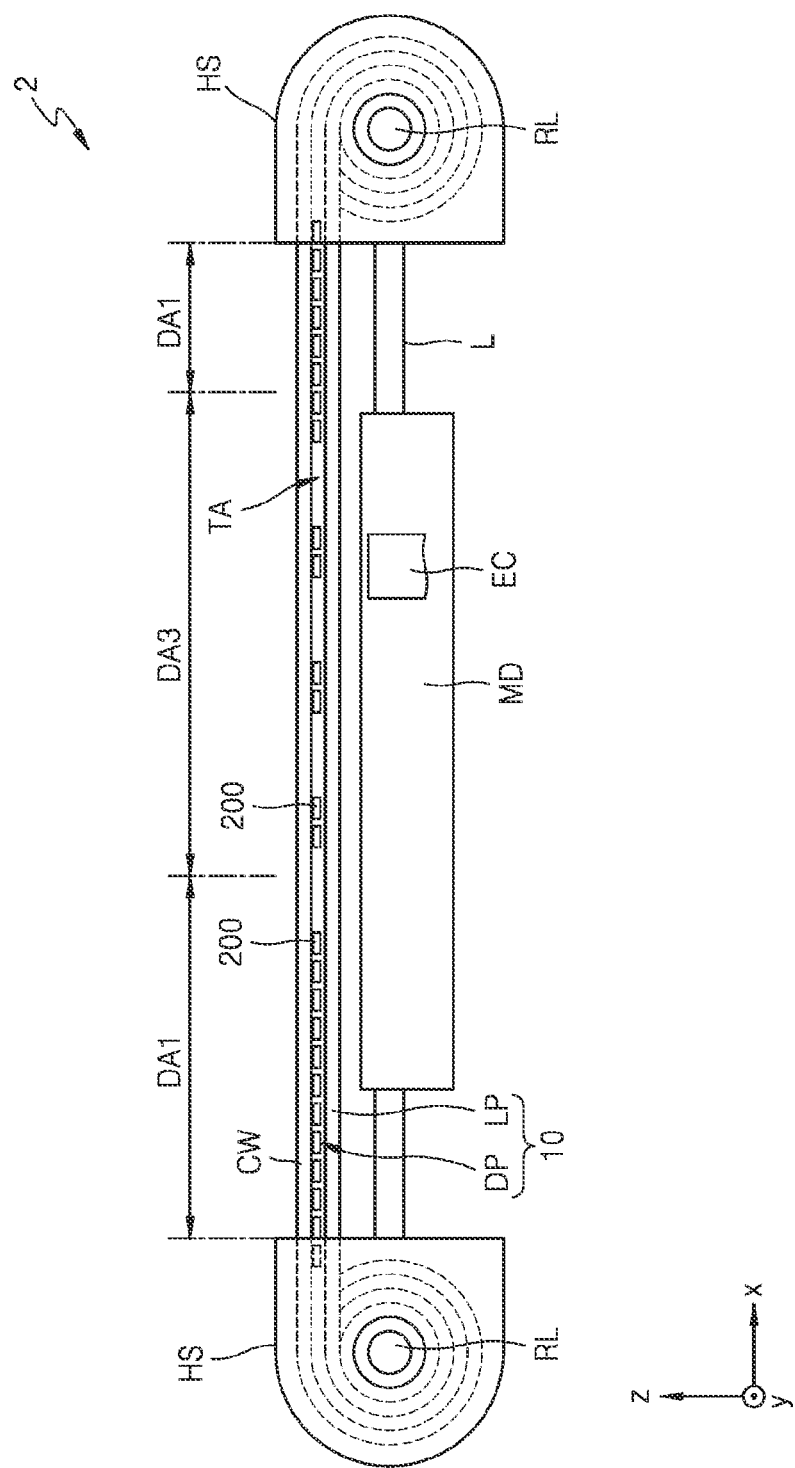
FIG. 16 is a cross-sectional view schematically illustrating the electronic apparatus of FIGS. 15A and 15B.

FIGS. 15A and 15B are perspective views schematically illustrating an electronic apparatus 2 according to another embodiment. FIG. 16 is a cross-sectional view schematically illustrating the electronic apparatus 2 of FIGS. 15A and 15B. FIG. 15A illustrates that the electronic apparatus 2 is in a wound state, i.e., in a rolled state, and FIG. 15B illustrates that the electronic apparatus 2 is in a wound state, i.e., in an unrolled state.

Referring to FIGS. 15A, 15B, and 16, the electronic apparatus 2 may include a display device 10 including the display panel DP, a roller unit RL, a housing unit HS, an electronic component EC, a module unit MD, and a distance adjustment unit L.

The display panel DP of the display device 10 as a flexible display panel that is flexible and may be easily bent, folded, or rolled, may be a rollable display panel that may be rolled or unrolled.

The display panel DP may be rolled or unrolled by the roller unit RL. For example, when the display panel DP is rolled by the roller unit RL, the display panel DP may be exposed between housing units HS by a first distance dis1 in a first direction (for example, x-direction or −x-direction) of the display panel DP. In this case, a portion of the display area DA of the exposed display panel DP may be defined as a first display area DA1.

When the display panel DP is unrolled by the roller unit RL, the display panel DP may be exposed between the housing units HS by a second distance dis2 in the first direction (for example, x-direction or −x-direction) of the display panel DP. The first distance dis1 may be less than the second distance dis2. In this case, a portion of the display area DA of the display panel DP to be additionally exposed may be defined as a rolling display area RDA. In an embodiment, the display panel DP may include a first rolling display area RDA1 and a second rolling display area RDA2, which are respectively arranged on both sides of the first display area DA1 disposed at the center. In this way, the size of the display area DA of the display panel DP exposed between the housing units HS and recognized by the user may be changed.

The display panel DP may include the first display area DA1, and a third display area DA3 that is at least partially surrounded by the first display area DA1. The third display area DA3 may include a transmissive area TA.

The third display area DA3 may extend in the first direction (for example, x-direction) and in a second direction (for example, the y-direction). In an embodiment, a first length dx in the first direction (for example, x-direction) of the third display area DA3 may be greater than a second length dy in the second direction (for example, the y-direction) of the third display area DA3. In this case, the third display area DA3 may have a rectangular shape with long sides in a direction in which the display panel DP is folded or unfolded.

In an embodiment, a cover window OW may be arranged on an upper surface of the display panel DP, and a lower protective layer LP may be arranged on a lower surface of the display panel DP. The display panel DP and the lower protective layer LP may constitute the display device 10.

The roller unit RL may roll the display panel DP. Alternatively, the roller unit RL may unroll the display panel DP. In some embodiment, the roller unit RL may be connected to a driving unit. In this case, the driving unit may include a motor, or the like and may rotate the roller unit RL. Alternatively, the roller unit RL may roll or unroll the display panel DP manually.

The housing units HS may accommodate the roller unit RL. Thus, a portion of the display panel DP may be accommodated in the housing units HS. A portion of the display panel DP may be brought into the housing unit HS or taken out of the housing unit HS.

For example, two housing units HS may expose a portion of the display panel DP therebetween. For example, two housing units HS may be spaced apart from each other in the first direction (for example, x-direction or −x-direction), and the display panel DP may be exposed by a distance at which the two housing units HS are spaced apart from each other.

In FIGS. 15A, 15B, and 16, two roller units RL and two housing units HS, which are respectively spaced apart from each other in the first direction (for example, x-direction or −x-direction), are provided. However, embodiments are not limited thereto, and only one roller unit RL and only one housing unit HS may also be provided.

The electronic component EC may be an electronic element using light or sound and is the same as described above, and thus, a redundant description therewith will be omitted. The electronic component EC may overlap the third display area DA3 of the display panel DP. Also, the electronic component EC may be arranged below the display panel DP. In an embodiment, the electronic component EC may be arranged in the module unit MD.

The module unit MD may be arranged below the display panel DP. In this case, the module unit MD may support the display panel DP. In an embodiment, the module unit MD may guide the display panel DR For example, in the case of the flexible display panel DP, the display panel DP may be bent by its own weight. In this case, the module unit MD supports the display panel DP so that the display panel DP may be prevented from being bent by its own weight.

In an embodiment, the module unit MD may include a high modulus material. For example, the module unit MD may include at least one selected from the group consisting of invar, nobinite, stainless, and an alloy thereof.

In an embodiment, the electronic component EC may be arranged in the module unit MD. In this case, the module unit MD may include a control circuit electrically connected to the electronic component EC. Also, the module unit MD may generate and output signals and voltages for driving the display panel DP.

The distance adjustment unit L may adjust a distance between the module unit MD and the housing unit HS. In this case, the distance adjustment unit L may be arranged between the module unit MD and the housing unit HS. The distance adjustment unit L may extend or may be reduced in the first direction (for example, x-direction or −x-direction). Thus, the distance adjustment unit L may adjust the distance between module unit MD and the housing unit HS.

For example, when the distance adjustment unit L extends, the distance between the module unit MD and the housing unit HS may be increased. In this case, the display panel DP may be unrolled from the roller unit RL. In another example, when the distance adjustment unit L is reduced, the distance between the module unit MD and the housing unit HS may be reduced. In this case, the display panel DP may be rolled by the roller unit RL. In an embodiment, the distance adjustment unit L may include a cylinder. Alternatively, the distance adjustment unit L may include a rack and pinion structure.

In the present embodiment, when the display panel DP is rolled and unrolled, a position in which the electronic component EC on the plane overlaps the third display area DA3, may change. The third display area DA3 may include a first area AR1 and a second area AR2, which are connected to each other in parallel in the first direction (for example, x-direction or −x-direction). In a state in which the display panel DP is in a rolled state, as shown in FIG. 15A, the electronic component EC may be arranged to overlap the first area AR1 of the third display area DA3 on the plane.

Then, as shown in FIG. 15B, the display panel DP may be unrolled from the roller unit RL. In this case, the distance adjustment unit L may extend so that a distance between the module unit MD and the housing unit HS may be increased. The electronic component EC may be arranged to overlap the second area AR2 of the third display area DA3 on the plane.

In this way, even when the display panel DP is unrolled or rolled, the electronic component EC may overlap the third display area DA3, Thus, even when the display panel DP is unrolled or rolled, light and/or sound emitted from the electronic component EC or directed toward the electronic component EC may be transmitted through the third display area DA3.

Figure 17A:
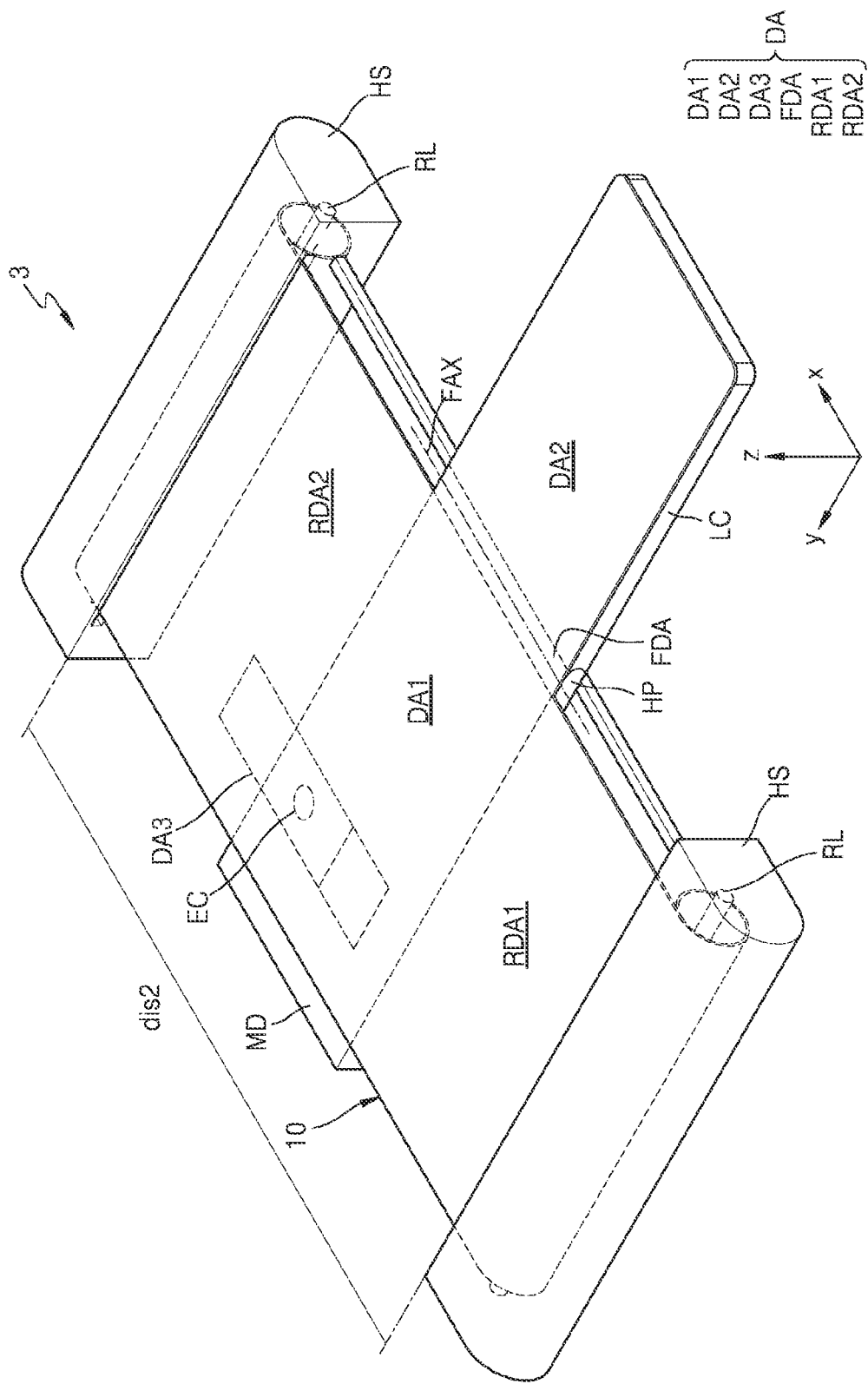
FIGS. 17A and 17B are perspective views schematically illustrating an electronic apparatus according to another embodiment.
Figure 17B:
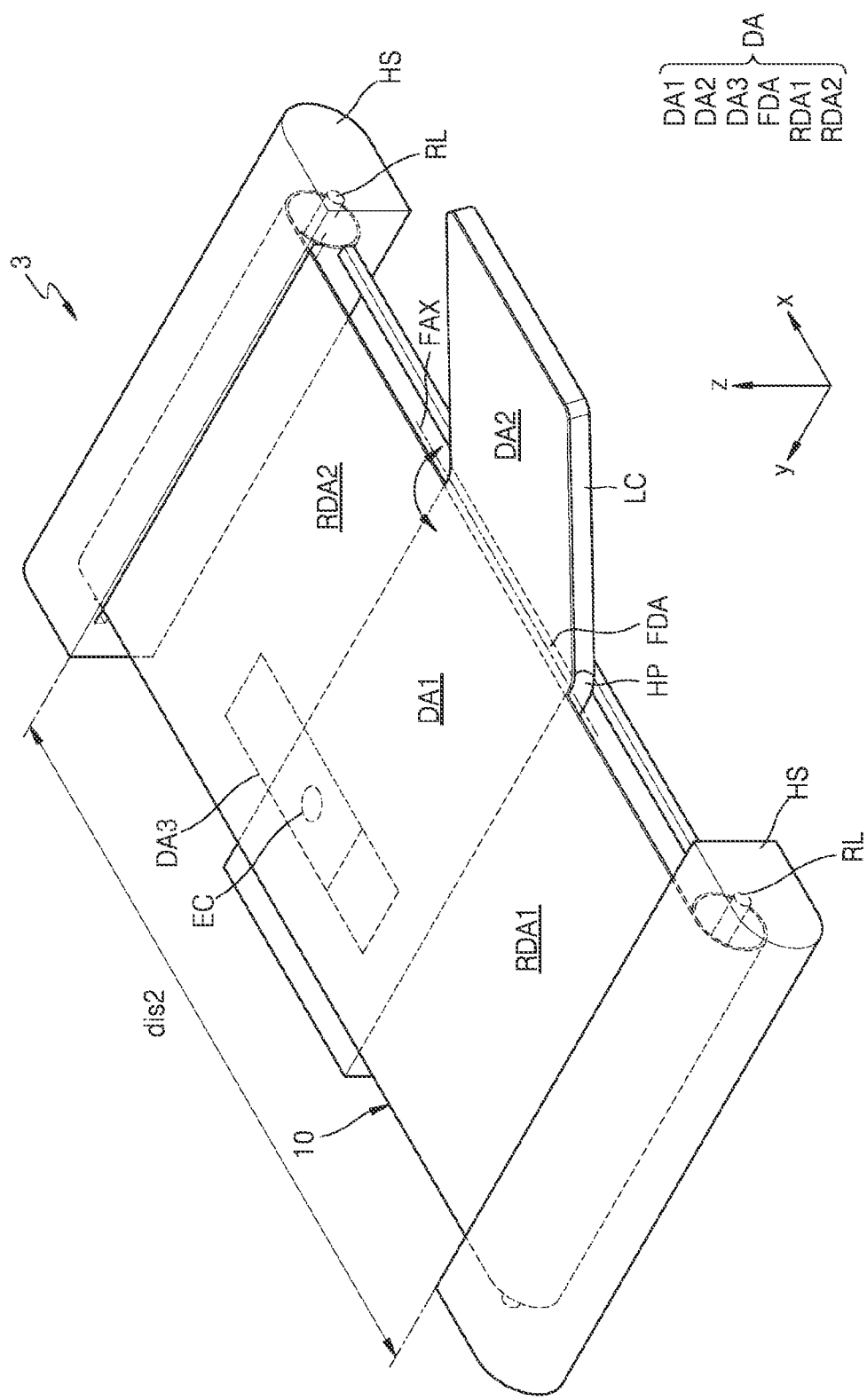

FIGS. 17A and 17B are perspective views schematically illustrating an electronic apparatus 3 according to another embodiment. FIG. 17A illustrates that the electronic apparatus 3 is in an unrolled and unfolded state, and FIG. 17B illustrates that the electronic apparatus 3 is in an unrolled and folded state.

Referring to FIGS. 17A and 17B, the electronic apparatus 3 may include a display device 10 for providing an image, and a lower cover LC arranged on a lower portion of the display device 10. Also, the electronic apparatus 3 may include a roller unit RL, a housing unit HS, an electronic component EC, a module unit MD, and a distance adjustment unit L.

The display device 10 of the electronic apparatus 3 may be a foldable and rollable display device 10, For example, the display device 10 may include a display panel DP including a first display area DA1, a second display area DA2 including a keyboard area KA, and a folding display area FDA between the first display area OA1 and the second display area DA2.

The display device 10 may include a cover window CW arranged on a front surface of the display panel DP, and a base plate (see BP of FIG. 5) arranged on a rear surface of the display panel DP. Any one of the embodiments described above with reference to FIGS. 5 through 14B may be employed for the stacked structure and features of the display device 10. For example, the cover window CW may include a first section and a second section, which respectively overlap the first display area DA1 and the second display area DA2 on the plane. The thickness of the first section and the thickness of the second section of the cover window CW may be different from each other. For example, the thickness of the second section may be greater than the thickness of the first section. In an example, the thickness of the first section may be 30 to 100 μm, and the thickness of the second section may be 100 to 500 μm.

The display panel DP of the display device 10 may include a first rolling display area RDA1 and a second rolling display area RDA2, which are respectively arranged on both sides of the first display area DA1 disposed at the center. The first rolling display area RDA1 and the second rolling display area RDA2 may be implemented by employing the embodiments descried above with reference to FIGS. 15A, 15B, and 16, and a redundant description therewith will be omitted.

In an embodiment, the cover window CW may include a third section and a fourth section, which respectively overlap the first rolling display area RDA1 and the second rolling display area RDA2. The third section and the fourth section of the cover window CW may have the same thickness as that of the first section of the cover window CW described above.

The lower cover LC may be connected to the module unit MD to be foldable. To this end, the lower cover LC may include a hinge portion HP. The lower cover LC may be folded about the folding axis FAX, as shown in FIG. 17B. Thus, the display device 10 may be folded together. The folding display area FDA may be an area bent as the display device 10 is folded. When the display device 10 is folded, the first display area DA1 and the second display area DA2 of the display device 10 may face each other.

According to an embodiment as described above, a display device in which a display area includes a keyboard area and structural characteristics of the keyboard area are reinforced, and an electronic apparatus including the display device may be implemented. Also, a display device having an extended display area so that an image may be displayed even in an area where an electronic component is arranged, and an electronic apparatus including the display device may be implemented. Furthermore, a display device in which the overall size of an electronic apparatus may be reduced and the area of the display area may be increased, and an electronic apparatus including the display device during use may be implemented. The scope of the present disclosure is not limited by these effects.

Until now, a display device and an electronic apparatus including the same have been mainly described, but the present disclosure is not limited thereto. For example, it will be understood that a method of manufacturing the display device and the electronic apparatus including the display device also falls within the scope of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a display panel comprising a first display area, a second display area including a keyboard area, and a folding display area between the first display area and the second display area;
   a cover window arranged on a front surface of the display panel and comprising a first section and a second section, wherein the first section and the second section respectively overlap the first display area and the second display area on a plane; and
   a base plate arranged on a rear surface of the display panel,
   wherein a thickness of the second section of the cover window is greater than a thickness of the first section of the cover window.

2. The display device of claim 1, further comprising:
   a foldable plate arranged on the base plate; and
   a metal sheet arranged on the foldable plate.

3. The display device of claim 2, further comprising a cushion layer between the base plate and the foldable plate and overlapping the second display area on the plane.

4. The display device of claim 2, wherein a portion of the metal sheet overlapping the keyboard area in the second display area is thicker than a portion of the metal sheet overlapping the first display area.

5. The display device of claim 2, wherein the metal sheet comprises:
   a first metal sheet entirely overlapping the display panel; and
   a second metal sheet arranged on one surface of the first metal sheet and overlapping the keyboard area of the second display area.

6. The display device of claim 2, further comprising a first adhesive layer and a second adhesive layer arranged on one surface of the foldable plate and respectively overlapping the first display area and the second display area,
   wherein the first adhesive layer has a higher elongation rate than an elongation rate of the second adhesive layer.

7. The display device of claim 1, wherein the display panel further comprises a first rolling display area and a second rolling display area arranged at to two opposite sides of the first display area.

8. An electronic apparatus comprising:
   a display device configured to provide an image; and a lower cover arranged on a lower portion of the display device,
wherein the display device comprises:
a display panel comprising a first display area, a second display area including a keyboard area, and a folding display area between the first display area and the second display area;
a cover window arranged on a front surface of the display panel and comprising a first section and a second section, wherein the first section and the second section respectively overlap the first display area and the second display area on a plane; and
a base plate arranged on a rear surface of the display panel,
wherein a thickness of the second section of the cover window is greater than a thickness of the first section of the cover window.

9. The electronic apparatus of claim 8, wherein the base plate of the display device comprises:
a first base plate overlapping the first display area on a plane and being slidable with respect to the lower cover; and
a second base plate spaced apart from the first base plate on the plane, overlapping the second display area and attached to the lower cover.

10. The electronic apparatus of claim 9, further comprising an elastic member configured to connect between the lower cover and the first base plate of the base plate.

11. The electronic apparatus of claim 8, wherein the display device further comprises:
a foldable plate arranged on the base plate; and
a metal sheet arranged on the foldable plate.

12. The electronic apparatus of claim 11, wherein the display device further comprises a cushion layer between the base plate and the foldable plate and overlapping the second display area on the plane.

13. The electronic apparatus of claim 11, wherein a portion of the metal sheet of the display device overlapping the keyboard area of the second display area is thicker than a portion of the metal sheet of the display device overlapping the first display area.

14. The electronic apparatus of claim 11, wherein the metal sheet of the display device comprises:
a first metal sheet entirely overlapping the display panel; and
a second metal sheet arranged on one surface of the first metal sheet and overlapping the keyboard area of the second display area.

15. The electronic apparatus of claim 11, further comprising a first adhesive layer and a second adhesive layer arranged on one surface of the foldable plate and respectively overlapping the first display area and the second display area, wherein the first adhesive layer has a higher elongation rate than an elongation rate of the second adhesive layer.

16. The electronic apparatus of claim 11, wherein the display panel of the display device further comprises a third display area at least partially surrounded by the first display area on the plane and having a lower resolution than a resolution of the first display area.

17. The electronic apparatus of claim 16, wherein each of the base plate, the foldable plate, and the metal sheet of the display device comprises a hole aligned with the third display area.

18. The electronic apparatus of claim 16, further comprising an electronic component aligned with the third display area.

19. The electronic apparatus of claim 18, wherein the electronic component overlaps the third display area when the display device is folded as well as the display device is unfolded.

20. The electronic apparatus of claim 8, further comprising a force sensor arranged on a lower portion of the display device and overlapping a portion of the second display area on the plane.

21. The electronic apparatus of claim 8, wherein the display panel of the display device further comprises a first rolling display area and a second rolling display area arranged at two opposite sides of the first display area.

* * * * *